United States Patent
Akamatsu et al.

(10) Patent No.: US 6,393,577 B1
(45) Date of Patent: *May 21, 2002

(54) SEMICONDUCTOR INTEGRATED CIRCUIT SYSTEM, SEMICONDUCTOR INTEGRATED CIRCUIT AND METHOD FOR DRIVING SEMICONDUCTOR INTEGRATED CIRCUIT SYSTEM

(75) Inventors: Hironori Akamatsu, Hirakata; Toru Iwata, Osaka, both of (JP)

(73) Assignee: Matsushita Electric Industrial Co., Ltd., Kadoma (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,716

(22) Filed: Jul. 15, 1998

(30) Foreign Application Priority Data

Jul. 18, 1997 (JP) ............................................. 9-194637

(51) Int. Cl.⁷ ............................. G06F 13/42; G06F 5/06
(52) U.S. Cl. ........................ 713/600; 713/400; 713/503
(58) Field of Search ................................. 713/400, 600, 713/500, 501, 502, 503, 401, 340; 709/208, 211; 710/61

(56) References Cited

U.S. PATENT DOCUMENTS

| | | | | |
|---|---|---|---|---|
| 4,819,164 A | * | 4/1989 | Branson ..................... 364/200 |
| 4,860,001 A | * | 8/1989 | Yamanaka et al. ........ 340/825.2 |
| 5,043,596 A | * | 8/1991 | Masuda et al. .............. 327/237 |
| 5,287,292 A | * | 2/1994 | Kenny et al. ................ 364/550 |
| 5,408,640 A | * | 4/1995 | MacIntyre et al. .......... 395/550 |
| 5,434,862 A | * | 7/1995 | Lokhoff .................... 370/85.11 |
| 5,448,159 A | | 9/1995 | Kojima et al. ............... 323/315 |
| 5,497,263 A | * | 3/1996 | Masuda et al. .............. 327/278 |
| 5,502,838 A | * | 3/1996 | Kikinis ......................... 713/501 |
| 5,586,308 A | * | 12/1996 | Hawkins et al. ............. 395/556 |
| 5,729,766 A | * | 3/1998 | Cohen .......................... 395/878 |
| 5,751,711 A | * | 5/1998 | Sakaue ......................... 370/431 |
| 5,769,876 A | * | 6/1998 | Silvian .......................... 607/60 |
| 5,774,702 A | * | 6/1998 | Mitsuishi et al. ........... 395/556 |
| 5,774,704 A | * | 6/1998 | Williams ..................... 713/501 |
| 5,935,257 A | * | 8/1999 | Nishimura ................... 713/503 |
| 5,941,990 A | * | 8/1999 | Hiiragizawa ................. 713/310 |
| 5,978,426 A | * | 11/1999 | Glover et al. ................ 375/376 |
| 5,996,084 A | * | 11/1999 | Watts ........................... 713/323 |

FOREIGN PATENT DOCUMENTS

KR 95-4275 2/1995

OTHER PUBLICATIONS

Draft 0.99 IEEE, p. 1596.7–199X, 1996, Draft Standard for a High–Speed Memory Interface (Synclink).
Direct RDRAM 64/72–Mbit (256Kx16/18x16d), 1997, "Overview".

* cited by examiner

Primary Examiner—Thomas Lee
Assistant Examiner—Thuan Du
(74) Attorney, Agent, or Firm—Renner, Otto, Boisselle & Sklar

(57) ABSTRACT

The present invention provides a semiconductor integrated circuit system, having one master chip and a plurality of slave chips, for performing data transfer under a control of a predetermined clock. The system includes: a detection section for detecting a change in a state of the semiconductor integrated circuit system and for producing information indicating the detection result, the state including at least one of temperature and source voltage; and at least one clock phase adjustment section for receiving the information and for adjusting a phase of a clock used in transferring data output by the slave chip based on the information.

15 Claims, 20 Drawing Sheets

FIG.9A

| Input | | | Output | | Command description |
|---|---|---|---|---|---|
| T1 | T2 | T3 | TV0 | TV1 | |
| 0 | 0 | 0 | 0 | 0 | Temperature setting 1 |
| 0 | 0 | 1 | 0 | 1 | Temperature setting 2 |
| 0 | 1 | 1 | 1 | 0 | Temperature setting 3 |
| 1 | 1 | 1 | 1 | 1 | Temperature setting 4 |

FIG.9B

| Input | | | Output | | Command description |
|---|---|---|---|---|---|
| V1 | V2 | V3 | TV2 | TV3 | |
| 0 | 0 | 0 | 0 | 0 | Voltage setting 1 |
| 0 | 0 | 1 | 0 | 1 | Voltage setting 2 |
| 0 | 1 | 1 | 1 | 0 | Voltage setting 3 |
| 1 | 1 | 1 | 1 | 1 | Voltage setting 4 |

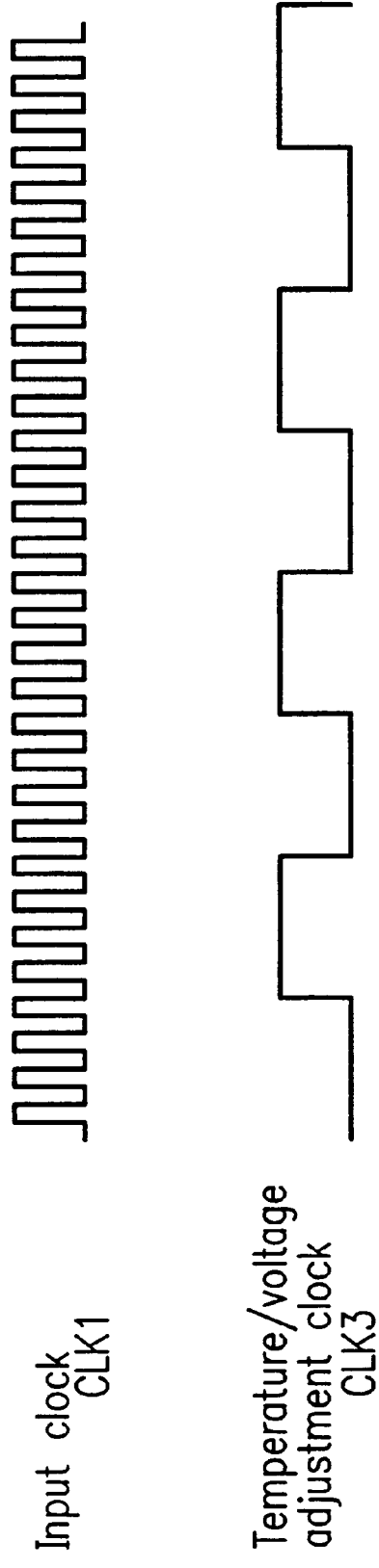

SEMICONDUCTOR INTEGRATED CIRCUIT SYSTEM, SEMICONDUCTOR INTEGRATED CIRCUIT AND METHOD FOR DRIVING SEMICONDUCTOR INTEGRATED CIRCUIT SYSTEM

BACKGROUND OF THE INVENTION

1. Field of the Invention

The present invention relates to a semiconductor integrated circuit system, a semiconductor integrated circuit and a method for driving a semiconductor integrated circuit system. More particularly, the present invention relates to a semiconductor integrated circuit system for high-speed data transfer in synchronization with a clock, a method for driving such a semiconductor integrated circuit system, and a semiconductor integrated circuit for use in such a semiconductor integrated circuit system.

2. Description of the Related Art

In recent years, a new line of products has been developed for use in multimedia applications. One major feature of a multimedia application is the capability of handling motion pictures as well as characters, still images and sounds. Motion picture processing involves a huge amount of data, thereby requiring a high data transfer rate. One way to realize such a high data transfer rate is to increase a bus width of a data bus so as to transfer a large amount of data. However, when the bus width of a data bus is increased, the scale of the system is adversely increased. In view of this, it has been proposed to increase the data transfer rate (clock frequency) without increasing the bus width of a data bus so as to provide a semiconductor integrated circuit system capable of transferring a large amount of data at a very high speed.

For example, a system using SyncLink DRAM, which inputs/outputs data at the dual edges of the clock, has been proposed and is described in Draft Standard for A High-Speed Memory Interface (SyncLink)-Draft 0.99 IEEE P1596.7-199X or "RAMBUS; PRODUCT CATALOG". In such a semiconductor integrated circuit system, when the clock speed is increased in order to realize a high-speed data transfer, problems occur such as a clock skew or a skew between chips, due to the difference between the distance (bus length) from one slave chip to the master chip and the distance from another slave chip to the master chip. In view of this, in the above-described SyncLink system, the slave chips are each provided with a circuit for delaying (or adjusting the phase of) the data output clock for controlling the timing of data output based on the positional relationship with (or the bus length to) the master chip, as illustrated in Draft 0.99 IEEE P1596.7-199X, P.43, FIG. 36, for example.

The distance from each slave chip to the master chip is detected at initialization of the system, so that a predetermined amount of delay in accordance with the distance is set in a circuit for adjusting the phase of the clock (hereinafter, referred to simply as the "clock phase adjustment circuit") in the slave chip. The phase of the data output clock of each slave chip is adjusted as described above, so that the master chip can receive data from respective slave chips simultaneously, whereby it is possible to stably perform high-speed data transfer.

However, such a conventional integrated circuit system as described above may include IC chips (semiconductor integrated circuits) which are not all from the same manufacturer. Among IC chips from different manufacturers, dependency or source voltage dependency) of the data output clock phase adjustment circuit provided in one IC chip may differ from those of another IC chip. The inventors of the present invention found that such difference in the characteristics of the data output clock phase adjustment circuit among the IC chips is particularly problematic in systems for high-speed data transfer such as those operating at a clock frequency of 200 MHz or higher. Such a change in the temperature or source voltage in a semiconductor integrated circuit system can easily occur, for example, due to the increasing temperature during use or when running an application with a large power consumption.

Thus, when a semiconductor integrated circuit system has IC chips from various manufacturers, even if a proper amount of delay is set, at system initialization, for the clock phase adjustment circuit of each IC chip in accordance with the bus length thereof, when an operating condition of the system such as the temperature or source voltage thereof changes from that at initialization, the amount of delay of each IC chip shifts from the proper value. Since the shift in the amount of delay may vary among the IC chips depending upon the characteristics (e.g., the temperature dependency, the voltage dependency, etc.) of the clock phase adjustment circuits of the respective IC chips, the amount of delay of each IC chip gradually becomes mismatched with another as the operation conditions of the system change. Then, the clock skew among the IC chips cannot be compensated for, whereby the stable operation of the system may not be ensured.

Moreover, even if the manufacturers make an agreement on standardizing those characteristics such as the temperature dependency or voltage dependency of a transistor, for example, it is difficult for the manufacturers to standardize such device characteristics over a wide range of temperature or voltage (e.g., to standardize the temperature dependency over a range of −100° C. to +100° C.). Therefore, such an agreement is not realistic.

Furthermore, even when the system is provided with IC chips from one manufacturer, the IC chips do not always have the same circuit characteristics due to possible variation among different lots.

SUMMARY OF THE INVENTION

According to one aspect of this invention, a semiconductor integrated circuit system, having one master chip and a plurality of slave chips, for performing data transfer under a control of a predetermined clock is provided. The system includes: a detection section for detecting a change in a state of the semiconductor integrated circuit system and for producing information indicating the detection result, the state including at least one of temperature and source voltage; and at least one clock phase adjustment section for receiving the information and for adjusting a phase of a clock used in transferring data output by the slave chip based on the information.

In one embodiment of the invention, the detection section is controlled by the master chip, and the at least one clock phase adjustment section is included in the slave chip.

In one embodiment of the invention, the master chip and the plurality of slave chips are each connected to a command bus for transferring a command, a first clock line carrying a command clock for controlling the command transfer, a data bus for transferring data and a second clock line carrying a data clock for controlling the data transfer. The detection section is provided in the master chip. The master chip further includes: a command production section for producing a command including as a part thereof the information produced by the detection section; and a command output section for outputting the command to the command bus based on the command clock. The slave chip includes: a clock input section for receiving the command clock from the first clock line; an input section for receiving the command from the command bus in accordance with the command clock; an extraction section for extracting the information included in the received command; a data output section for outputting data in the slave chip to the data bus in accordance with the data clock; and a clock output section for outputting the data clock to the second clock line. The at least one clock phase adjustment section receives the command clock and produces a data clock by adjusting a phase of the command clock based on the change in the state of the semiconductor integrated circuit system indicated by the information extracted by the extraction section.

In one embodiment of the invention, the command is transferred in a packet; and the command production section produces a command packet including the information and a chip ID.

In one embodiment of the invention, the at least one clock phase adjustment section comprises a plurality of delay units which are selectively used based on the change in the state of the semiconductor integrated circuit system.

In one embodiment of the invention, each of the plurality of slave chips comprises the detection section and the at least one clock phase adjustment section.

In one embodiment of the invention, the master chip and the plurality of slave chips are each connected to a command bus for transferring a command, a first clock line carrying a command clock for controlling the command transfer, a data bus for transferring data and a second clock line carrying a data clock for controlling the data transfer. Each of the plurality of slave chips further includes: a clock input section for receiving the command clock from the first clock line; an input section for receiving the command from the command bus in accordance with the command clock; a data output section for outputting data in the slave chip obtained based on the received command to the data bus in accordance with the data clock; and a clock output section for outputting the data clock to the second clock line. The at least one clock phase adjustment section produces the data clock by adjusting a phase of the command clock based on the change in the state of the semiconductor integrated circuit system indicated by the information provided by the detection section.

In one embodiment of the invention, the at least one clock phase adjustment section includes first and second clock phase adjustment sections. While one of the first clock phase adjustment section and the second clock phase adjustment section is performing phase adjustment in one operating cycle, the other one prepares for phase adjustment in a next operating cycle.

According to another aspect of this invention, a semiconductor integrated circuit operating in synchronization with a predetermined clock is provided. The semiconductor integrated circuit includes: a clock input section for receiving a command clock; a command input section for receiving a command in accordance with the command clock, the command including information indicating a change in a state which includes at least one of temperature and source voltage; an extraction section for extracting the information from the received command; at least one clock phase adjustment section for producing a data clock by adjusting a phase of the received command clock based on the change in the state indicated by the information extracted by the extraction section; a data output section for outputting data in the slave chip in accordance with the data clock; and a clock output section for outputting the data clock.

In one embodiment of the invention, the at least one clock phase adjustment section includes first and second clock phase adjustment sections. While one of the first clock phase adjustment section and the second clock phase adjustment section is performing phase adjustment in one operating cycle, the other one prepares for phase adjustment in a next operating cycle.

According to still another aspect of this invention, a semiconductor integrated circuit operating in synchronization with a predetermined clock is provided. The semiconductor integrated circuit includes: a clock input section for inputting a reference clock; a synchronization section for producing an internal clock corresponding to a source voltage level, the synchronization section receiving the reference clock, outputting the internal clock in synchronization with the reference clock by changing the source voltage level, and outputting as a reference voltage signal a source voltage level which is determined by synchronizing the internal clock with the reference clock; a source voltage generation section for generating a supply voltage based on the reference voltage signal; a clock phase adjustment section for receiving the internal clock, and outputting an output control clock by adjusting a phase of the internal clock based on the source voltage; and a data output section for outputting data in the semiconductor integrated circuit in accordance with the output control clock.

In one embodiment of the invention, a frequency of the reference clock in an operating mode of the semiconductor integrated circuit is different from that in a stand-by mode of the semiconductor integrated circuit system.

In one embodiment of the invention, the frequency of the reference clock in the operating mode is greater than that in the stand-by mode.

In one embodiment of the invention, the source voltage generation section includes a first source voltage generation section used in an operating mode of the semiconductor integrated circuit and a second source voltage generation section used in a stand-by mode of the semiconductor integrated circuit.

According to still another aspect of this invention, a semiconductor integrated circuit operating in synchronization with a predetermined clock is provided. The semiconductor integrated circuit includes: a first clock input section for inputting a reference clock; a second clock input section for inputting an adjustment clock; a synchronization section for producing an internal clock corresponding to a source voltage level, the synchronization section receiving the adjustment clock, synchronizing the internal clock with the adjustment clock by changing the source voltage level, and outputting as a reference voltage signal a source voltage level which is determined by the synchronization; a source voltage generation section for generating a source voltage based on the reference voltage signal; a clock phase adjustment section for receiving the reference clock, and outputting an output control clock by adjusting a phase of the reference clock based on the source voltage; and a data output section for outputting data in the semiconductor integrated circuit in accordance with the output control clock.

In one embodiment of the invention, the second clock input section produces the adjustment clock by dividing a frequency of the reference clock from the first clock input section.

According to still another aspect of this invention, a method for driving a semiconductor integrated circuit system which has one master chip and a plurality of slave chips for performing data transfer under a control of a predetermined clock is provided. The method includes the steps of: initializing a data transfer clock in each slave chip after power-up and before starting a read/write operation: detecting changes in temperature and source voltage so as to produce an information signal indicating the detection result; and adjusting a phase of the initialized data transfer clock in each slave chip based on the information signal.

Thus, the invention described herein makes possible the advantages of: (1) providing a semiconductor integrated circuit system capable of stably operating at a high speed even when a semiconductor integrated circuit system has IC chips from various manufacturers, or when the circuit characteristics (e.g., the temperature dependency, the voltage dependency, etc.) vary among respective IC chips; (2) providing a semiconductor integrated circuit for use in such a semiconductor integrated circuit system; and (3) providing a method for driving such a semiconductor integrated circuit system.

These and other advantages of the present invention will become apparent to those skilled in the art upon reading and understanding the following detailed description with reference to the accompanying figures.

BRIEF DESCRIPTION OF THE DRAWINGS

FIGS. 9A and 9B are diagrams each illustrating an example of encoding by the command production circuit;

FIG. 20 is a diagram illustrating waveforms of an input clock and a temperature/voltage adjustment clock.

DESCRIPTION OF THE PREFERRED EMBODIMENTS

Figure 1:
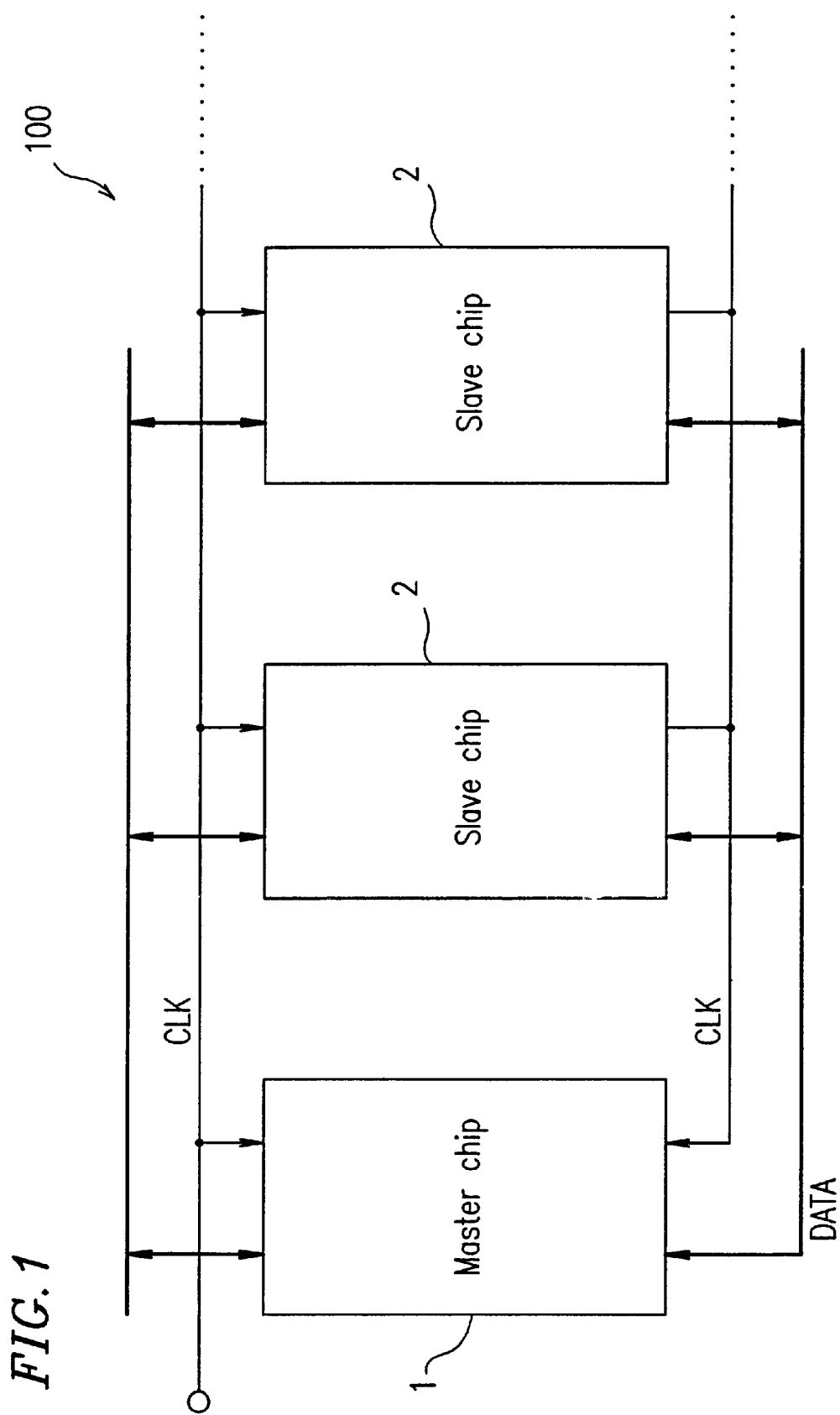
FIG. 1 is a block diagram schematically illustrating a semiconductor integrated circuit system of the present invention.

FIG. 1 is a block diagram schematically illustrating a semiconductor integrated circuit 100 of the present invention. As illustrated in FIG. 1, the semiconductor integrated circuit 100 includes one master chip 1 and a plurality of slave chips 2. Data processing (e.g., a read, write or arithmetic operation) is performed in each slave chip 2 under the control of the master chip 1, and the resultant data DATA from the slave chip 2 is transferred under the control of a predetermined clock CLK. The semiconductor integrated circuit 100 includes a detection section for detecting a change in the state (e.g., the temperature, the source voltage, etc.) of the semiconductor integrated circuit 100 and for producing information indicating the detection result, and a clock phase adjustment section for adjusting the phase of the clock used for transferring data which is output from the slave chip 2. The clock phase adjustment section receives information indicating the detection result from the detection section, and adjusts the phase of the clock based on this information.

Such a detection section can be controlled by the master chip 1. For example, the detection section can be provided in the master chip 1 while the clock phase adjustment section can be provided in each slave chip 2. The detection section may be provided within the master chip 1, or may be provided externally to the master chip 1 and provide the detection result to the master chip 1. Alternatively, the detection section may also be provided in the slave chip 2.

Hereinafter, examples of the present invention will be described in greater detail with reference to the accompanying drawings.

EXAMPLE 1

Figure 2:
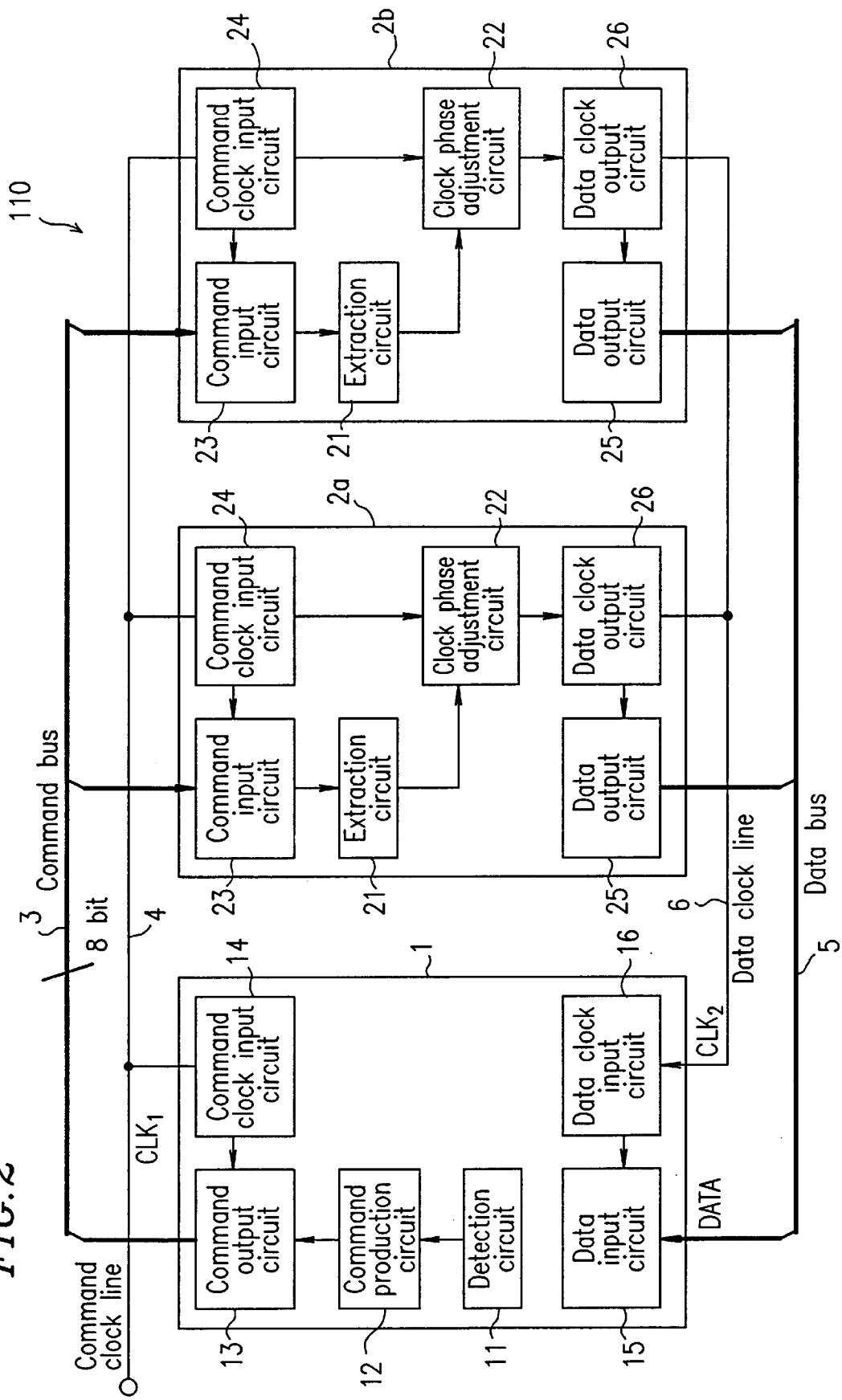
FIG. 2 is a block diagram schematically illustrating a semiconductor integrated circuit system according to Example 1 of the present invention.

FIG. 2 is a block diagram illustrating a semiconductor integrated circuit system 110 according to Example 1 of the present invention. In the present example, the semiconductor integrated circuit system 110 includes two slave chips 2, namely, a first slave chip 2a and a second slave chip 2b. The master chip 1 and the first and second slave chips 2a and 2b are each connected to a command bus 3 for transferring a command, a command clock line 4 carrying a command clock CLK1 for controlling command transfer, a data bus 5 for data transfer, and a data clock line 6 carrying a data clock CLK2 for controlling data transfer.

As illustrated in FIG. 2, the master chip 1 includes a detection circuit 11 for detecting a change in a state (operating environment) of the semiconductor integrated circuit system 110, a command production circuit 12 for producing a command which includes as a part of the command the information produced by the detection circuit 11, and a command output circuit 13 for outputting the produced command to the command bus 3 based on the command clock CLK1.

According to the present example, the source voltage and temperature are used as values for indicating the state of the semiconductor integrated circuit system 110. The detection circuit 11 detects changes in the source voltage and temperature in the semiconductor integrated circuit system 110, and produces information indicating the detection result. Moreover, the command clock CLK1 on the command clock line 4 is input to a command clock input circuit 14 of the master chip 1 and in turn is provided to the command output circuit 13.

Each of the slave chips 2a and 2b includes: a command clock input circuit 24 for receiving the command clock CLK1 from the command clock line 4; a command input circuit 23 for receiving a command from the command bus 3 in accordance with the command clock CLK1; an extraction circuit 21 for extracting, from the received command, information indicating changes in the source voltage and temperature; a clock phase adjustment circuit 22 for producing the data clock CLK2; a data output circuit 25 for outputting data in the slave chip to the data bus 5 in accordance with the data clock CLK2; and a data clock output circuit 26 for outputting the data clock CLK2 to the data clock line 6. The clock phase adjustment circuit 22 produces the data clock CLK2 by receiving the command clock CLK1 and adjusting the phase of the command clock CLK1 based on the change in the state of the semiconductor integrated circuit system 110 indicated by the information extracted by the extraction circuit 21.

Next, the operation of the master chip 1 and the slave chips 2 (2a and 2b) of the semiconductor integrated circuit system 110 will be described in detail.

As illustrated in FIG. 2, the master chip 1 outputs a command to the command bus 3 under the control of the command clock CLK1. Each of the slave chips 2a and 2b receives, at the command input circuit 23, the command transferred via the command bus 3 in accordance with the timing of the command clock CLK1 provided from the command clock line 4 to the command clock input circuit 24. The operation of the slave chip is determined based on the command.

The first and second slave chips 2a and 2b have different distances (bus lengths) to the master chip 1. Therefore, the data output timing of each slave chip is adjusted by delaying the input command clock CLK1 by the clock phase adjustment circuit 22. In other words, the data clock CLK2 for controlling data transfer is produced by delaying (or adjusting the phase of) the command clock CLK1. The slave chip 2 outputs data based on the data clock CLK2, so that data from one slave chip 2 and data from another arrive at the master chip 1 simultaneously. Thus, the data output circuit 25 of each slave chip 2 outputs data based on the data clock CLK2 whose timing is adjusted in accordance with the distance from the slave chip 2 to the master chip 1. Moreover, while data is output from the data output circuit 25 to the data bus 5, the data clock CLK2 used for the data output is simultaneously output from the data clock output circuit 26 to the data clock line 6. Thus, the data and the data clock CLK2, which determines the timing at which the data is received, can be made to arrive at the master chip 1 while maintaining an unshifted chronological relationship therebetween.

Such an amount of delay in accordance with the bus length (distance to the master chip 1) of each slave chip 2 is set in the clock phase adjustment circuit 22 of the slave chip 2 at the initialization of the semiconductor integrated circuit system 110 (i.e., at power-up, and before starting a read/write operation).

However, when the semiconductor integrated circuit system 110 includes a plurality of slave chips 2, and the clock phase adjustment circuit 22 of one slave chip 2 has certain operating characteristics in connection with the system operating state (e.g., the temperature or source voltage) which are different from those of another slave chip 2, it is necessary to re-set each clock phase adjustment circuit 22 in accordance with the change in the system operating state from that at the initialization.

In the present example, the detection circuit 11 for detecting changes in the source voltage and temperature is provided in the master chip 1. The changes in the source voltage and temperature detected by the detection circuit 11 are provided to the command production circuit 12 as information indicating changes in the system operating state. As will be described later, the command production circuit 12 produces a command including information indicating such changes and provides the information to the command output circuit 13. The command output circuit 13 outputs the command to the command bus 3 in accordance with the command clock CLK1 which is provided from the command clock input circuit 14. The output command is transferred via the command bus 3 to the first and second slave chips 2a and 2b. The command clock CLK1 is carried by the command clock line 4 to each chip.

The command clock CLK1 on the command clock line 4 is received by the command clock input circuit 24 of each slave chip 2. The command on the command bus 3 is received by the command input circuit 23 of each slave chip 2 which is controlled in accordance with the timing of the command clock CLK1 provided by the command clock input circuit 24. The received command is provided to the extraction circuit 21. The extraction circuit 21 extracts information indicating changes in the source voltage and temperature contained in the command. The extracted information indicating changes in the source voltage and temperature is provided to the clock phase adjustment circuit 22. The clock phase adjustment circuit 22 outputs the data clock CLK2 whose phase is adjusted by re-setting the amount of delay of the command clock CLK1 based on the change-related information. The data clock CLK2 is provided to the data clock output circuit 26. The data output circuit 25 outputs data in the slave chip 2 to the data bus 5 in accordance with the data clock CLK2 whose phase is adjusted based on the changes in the system operating state.

Figure 3:
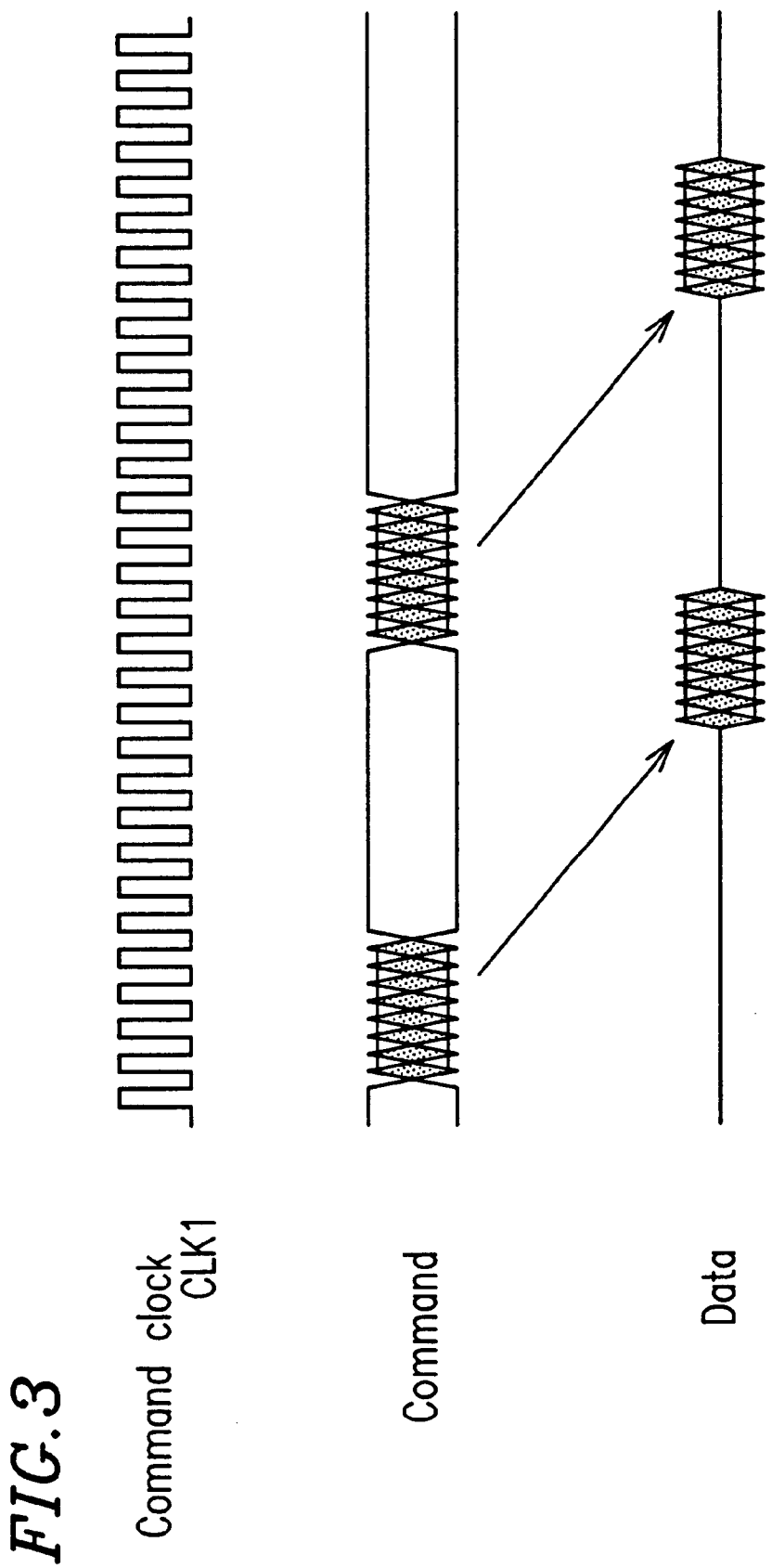
FIG. 3 is a timing diagram illustrating a timing of data output according to Example 1 of the present invention.

FIG. 3 schematically illustrates the timing of a read operation for reading data from a memory in the slave chip 2, as an example of the operation of the semiconductor integrated circuit system 110 as illustrated in FIG. 2. In this example, the command includes the above-described change-related information and a reading address in the slave chip 2. As illustrated in FIG. 3, the command is sent in a packet in synchronization with the command clock CLK1. Data resulting from the execution of this command (i.e., a read operation) is obtained after a predetermined time required for executing the command. The above similarly applies to the case where a predetermined arithmetic operation is executed in each slave chip 2.

Figure 4:
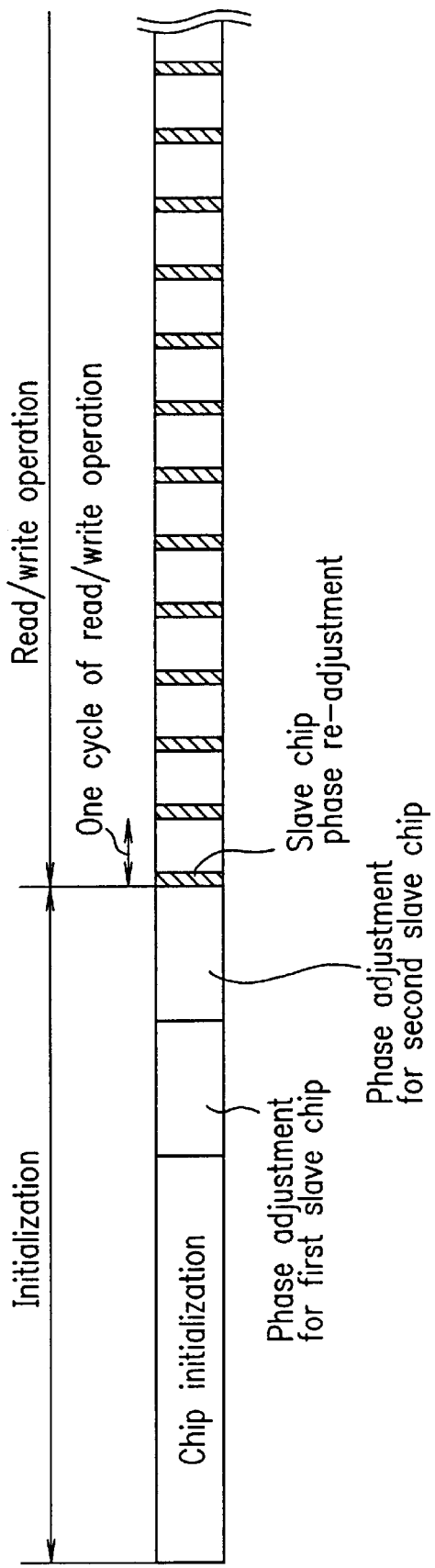
FIG. 4 is a timing diagram illustrating an exemplary timing for re-setting a clock phase adjustment circuit according to Example 1 of the present invention.

FIG. 4 is a timing diagram illustrating an example of the operation of the semiconductor integrated circuit system 110 from initialization to a read/write operation. At system initialization, all of the chips are first initialized. For example, the chip initialization includes resetting register circuits in the chip, turning on the internal power source, and the like. After initializing all chips, setting of the clock phase adjustment circuit 22 of each slave chip 2 is performed. For example, an amount of delay is first set in the clock phase adjustment circuit 22 of the first slave chip 2a (FIG. 2). Such setting is performed, as in a conventional SLDRAM, via data exchange between the master chip 1 (controller) and each slave chip 2. For example, the clock phase adjustment for the slave chip 2a can be performed by comparing the command clock CLK1 with the data clock CLK2 which is input to the master chip 1 via the slave chip 2a. After completing the phase adjustment for the slave chip 2a, an amount of delay is set in a similar manner in the clock phase adjustment circuit 22 of the second slave chip 2b. Although FIG. 2 illustrates an example where there are two slave chips 2, the number of the slave chips 2 is not limited to two. When there are provided more slave chips 2, the slave chips 2 can be successively set in a manner similar to that described above.

After completing the initialization for each chip, a normal processing operation such as a read/write operation is performed. After a read/write operation is started, the clock phase adjustment circuit 22 of the slave chip 2 is re-set for each cycle of the read/write operation. Thus, each time a read/write operation is performed, the phase of the data clock CLK2 in each slave chip 2 is re-adjusted in accordance with changes in the system operating state.

As described above, the clock phase adjustment circuit 22 is re-set for each cycle of a read/write operation. Therefore, even in the case of abrupt changes in the state of the semiconductor integrated circuit system 110 (e.g., a drop in the source voltage), it is possible to quickly adapt the system to the new state, and thus realize accurate and stable operation of the system. Such an adjustment is particularly advantageous when running an application with a large power consumption, for example.

Figure 5:
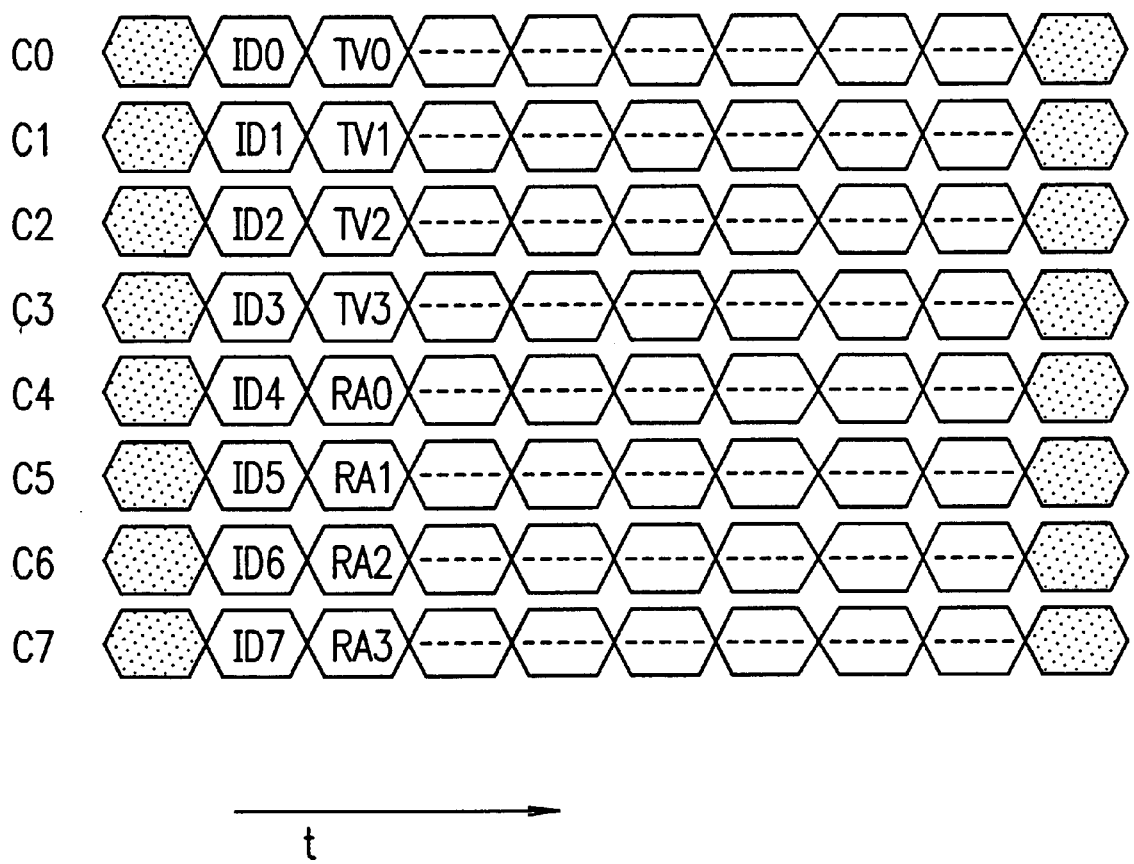
FIG. 5 is a diagram illustrating an example of a command packet according to Example 1 of the present invention.

FIG. 5 schematically illustrates an example of a structure of a command transferred in a packet via a command bus of 8 bits (C0 to C7). FIG. 5 illustrates a command packet including a command for performing a read/write operation. As illustrated in FIG. 5, in each command packet, the first cycle of the command clock corresponds to chip ID information (ID0 to ID7), which designates the slave chip to which the command is provided. The four bits (C0 to C3) of the command bus in the second cycle are assigned to be the information indicating changes in the operating state of the semiconductor integrated circuit system 110, thereby providing a command (TV0 to TV3) indicating information regarding changes in the temperature and source voltage. Thus, in each cycle of the read/write operation, after one slave chip 2 is designated, information indicating changes in the temperature and source voltage is sent, so as to reset the clock phase adjustment circuit 22 of the corresponding slave chip 2 before the read/write operation is performed. The remaining four bits (C4 to C7) of the command bus in the second cycle are assigned to be other information, such as, for example, row addresses (RA0 to RA3) of the slave chip 2.

Figure 6:
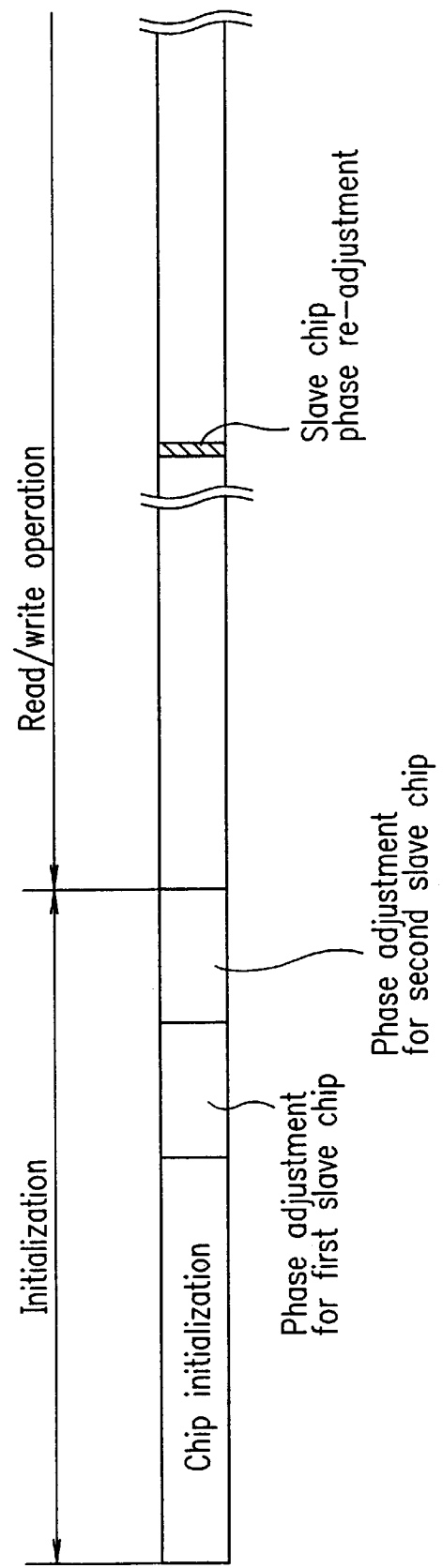
FIG. 6 is a timing diagram illustrating another exemplary timing for re-setting a clock phase adjustment circuit according to Example 1 of the present invention.

FIG. 6 is a timing diagram illustrating another example of the operation of the semiconductor integrated circuit system 110 from initialization to a read/write operation. The initialization operation is the same as that illustrated in FIG. 4. In the example illustrated in FIG. 6, after a read/write operation is started, the re-setting of the clock phase adjustment circuit 22 of each slave chip 2 is not performed for each cycle of the read/write operation, but is performed at every occurrence of a predetermined time period during the read/write operation. In such a case, a command for resetting the clock phase adjustment circuit 22 of the slave chip 2 may be output at every occurrence of the predetermined time period. Although not particularly illustrated in the figure, the re-setting of the clock phase adjustment circuit 22 may be performed for one slave chip 2 each time, or may be performed for all of the slave chips 2 at once.

When the phase is re-set at every occurrence of the predetermined time period, as described above, the efficiency of the read/write operation can be improved from that when the phase re-setting is performed for each cycle of the read/write operation. There is also an advantage that the length of each command packet is reduced.

Next, the operation of the master chip 1 for producing a command including information indicating changes in the operating state of the semiconductor integrated circuit system 110 will be described in greater detail.

Figure 7:
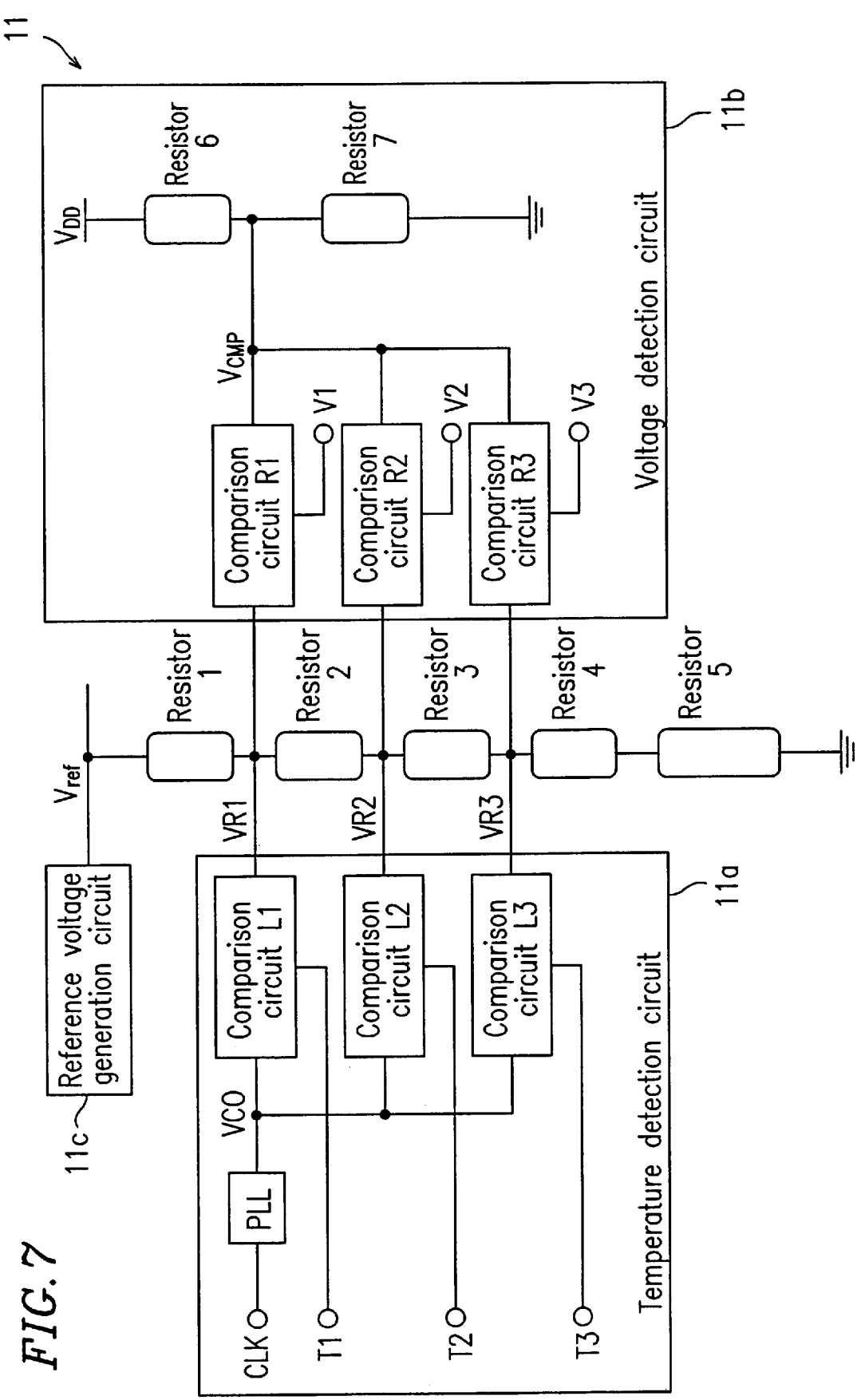
FIG. 7 is a diagram illustrating an example of a configuration of a detection circuit according to Example 1 of the present invention.

FIG. 7 illustrates an example of a configuration of the detection circuit 11 according to the present example. As illustrated in FIG. 7, the detection circuit 11 includes a temperature detection circuit 11a, a voltage detection circuit 11b and a reference voltage generation circuit 11c. The reference voltage generation circuit 11c generates a predetermined reference voltage independently of the temperature and source voltage of the semiconductor integrated circuit system 110. The reference voltage generation circuit 11c can be configured based on a conventional technique. For example, the "REFERENCE VOLTAGE GENERATOR" described in U.S. Pat. No. 5,448,159 can be used. The temperature detection circuit 11a includes a PLL therein, and utilizes the phenomenon that an output VC0 of a voltage controlled oscillator included in the PLL varies as the temperature changes. Thus, changes in the temperature are detected by comparing the value VC0 and each of the values VR1 to VR3 (obtained by subjecting the reference voltage $V_{ref}$ provided by the reference voltage generation circuit 11c to voltage division using register elements 1 to 5), at comparison circuits L1 to L3, and thereby determining the difference therebetween. The detection results are output from the comparison circuits L1 to L3 as temperature change detection signals T1 to T3.

Moreover, the voltage detection circuit 11b detects changes in the source voltage by comparing a voltage value $V_{CMP}$ (obtained by dividing a system source voltage $V_{DD}$ by resistor elements 6 and 7) and the reference voltage $V_{ref}$ (provided by the reference voltage generation circuit 11c) at comparison circuits R1 to R3, and thereby determining the difference therebetween. The detection results are output from the comparison circuits R1 to R3 as source voltage detection signals V1 to V3.

The temperature change detection signals T1 to T3 and the source voltage detection signals V1 to V3 are digital signals, as will be described later.

Figure 8:
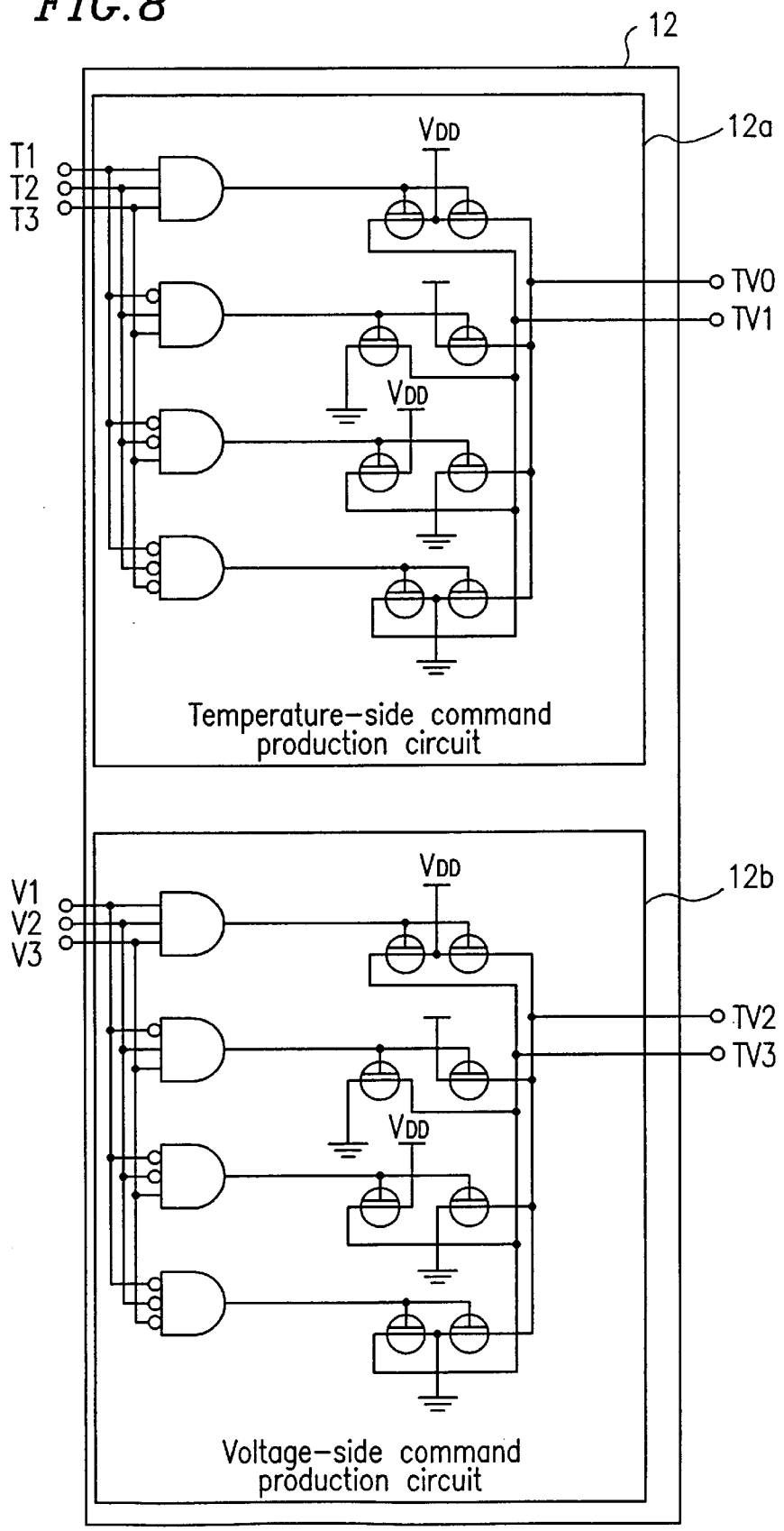
FIG. 8 is a diagram illustrating an example of a configuration of a command production circuit according to Example 1 of the present invention.

FIG. 8 illustrates an example of a configuration of the command production circuit 12 according to the p resent example. As illustrated in FIG. 8, the command production circuit 12 includes a temperature-side command production circuit 12a and a voltage-side command production circuit 12b. As illustrated in FIG. 8, the temperature-side command production circuit 12a receives and encodes the temperature change detection signals T1 to T3 so as to output a 2-bit command (TV0 and TV1) of temperature change information. FIG. 9A illustrates an example of encoding by the temperature-side command production circuit 12a. As illustrated in FIG. 9A, a temperature setting value is determined in accordance with the value of each bit (TV0 and TV1) of the command of temperature change information. In each slave chip 2, the amount of delay for the clock phase adjustment circuit 22 is re-adjusted based on the temperature setting which is determined by this command.

Similarly, as illustrated in FIG. 8, the voltage-side command production circuit 12b receives and encodes the source voltage detection signals V1 to V3 so as to output a 2-bit command (TV2 and TV3) of voltage change information. FIG. 9B illustrates an example of encoding by the voltage-side command production circuit 12b. As illustrated in FIG. 9B, a voltage setting value is determined in accordance with the value of each bit of the command o f voltage change information (TV2 and TV3). In each slave chip 2, the amount of delay for the clock phase adjustment circuit 22 is re-adjusted based on the voltage setting which is determined by this command.

Next, the extraction of information indicating a state change from a command in each slave chip 2, and the clock phase adjustment based on the extracted information will be described in detail.

Figure 10:
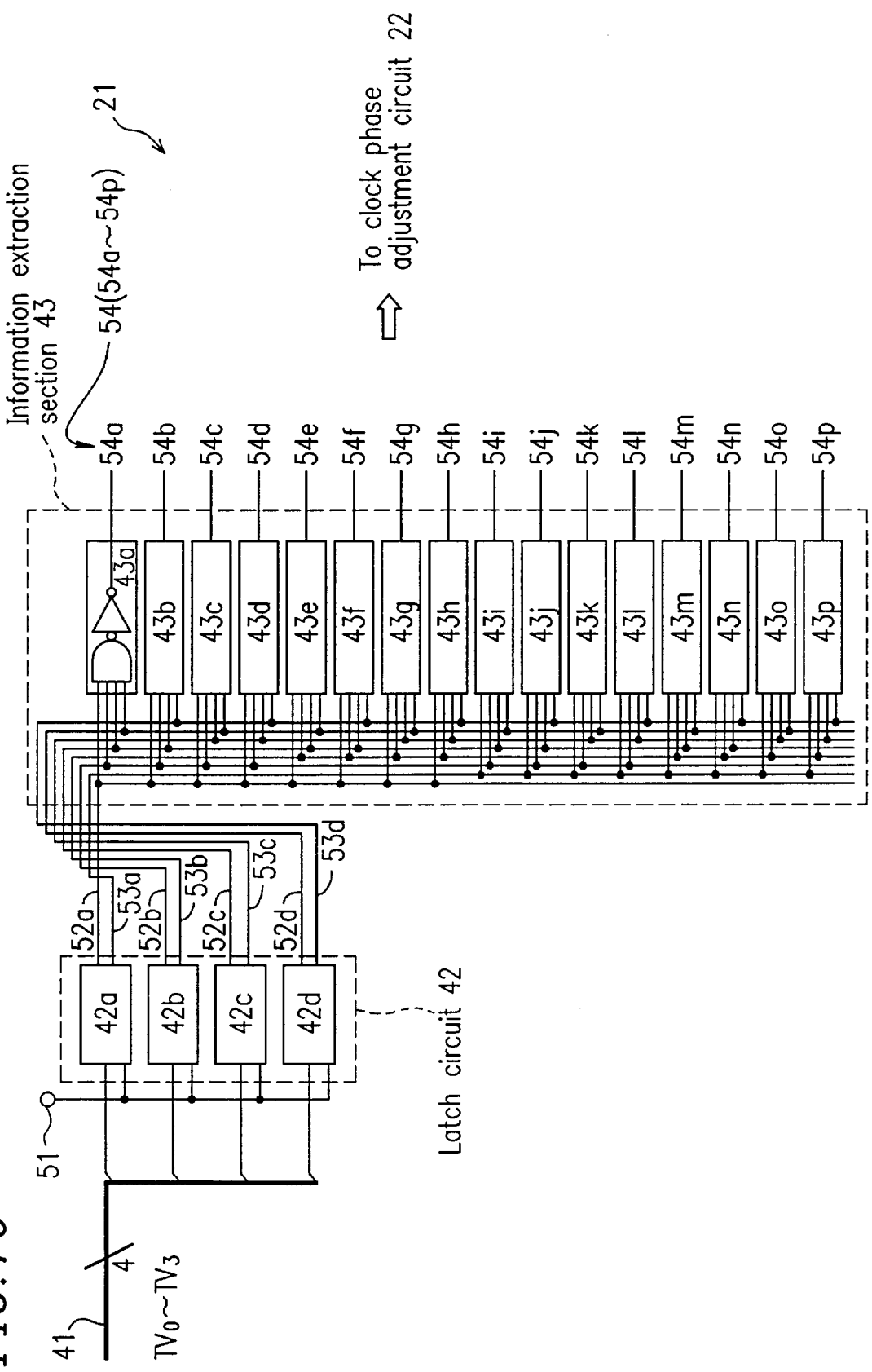
FIG. 10 is a diagram illustrating an example of a configuration of an extraction circuit according to Example 1 of the present invention.

FIG. 10 illustrates a detailed circuit configuration of the extraction circuit 21 in each slave chip 2 of the semiconductor integrated circuit system 110 as illustrated in FIG. 2. As illustrated in FIG. 10, the extraction circuit 21 includes a latch circuit 42 (42a to 42d) for latching the command (TV0 to TV3) provided by the command input circuit 23, and an information extraction section 43 (43a to 43p) for extracting information indicating changes in the temperature and source voltage.

The command TV0 to TV3 of change-related information indicating changes in the temperature and source voltage is provided from a command bus 41 (4 bits in the present example) in the extraction circuit 21 to the latch circuit 42. The latch circuit 42 includes the latch sections 42a to 42d corresponding to the respective bits, and the latch sections 42a to 42d are controlled by a latch circuit control signal 51. Outputs 52a to 52d respectively from the latch sections 42a to 42d and outputs 53a to 53d complementary thereto are provided to the information extraction section 43. The information extraction section 43 decodes the latched 4-bit command TV0 to TV3 using the decoder sections 43a to 43p so as to output adjustment signals 54a to 54p which correspond to 16 different setting values provided in accordance with the changes in the temperature and source voltage. The adjustment signal 54 (54a to 54p) obtained by the extraction circuit 21 is provided to the clock phase adjustment circuit 22.

As described above, in the present example, the 4-bit command TV0 to TV3 carries information including a temperature change (2 bits) and a source voltage change (2 bits). Thus, with the four different temperature conditions and the four different voltage conditions in combination, it is possible to have 16 different settings. The present invention is not limited to such an example. Accordingly, any other number of bits provided for a command can be set as necessary.

Figure 11:
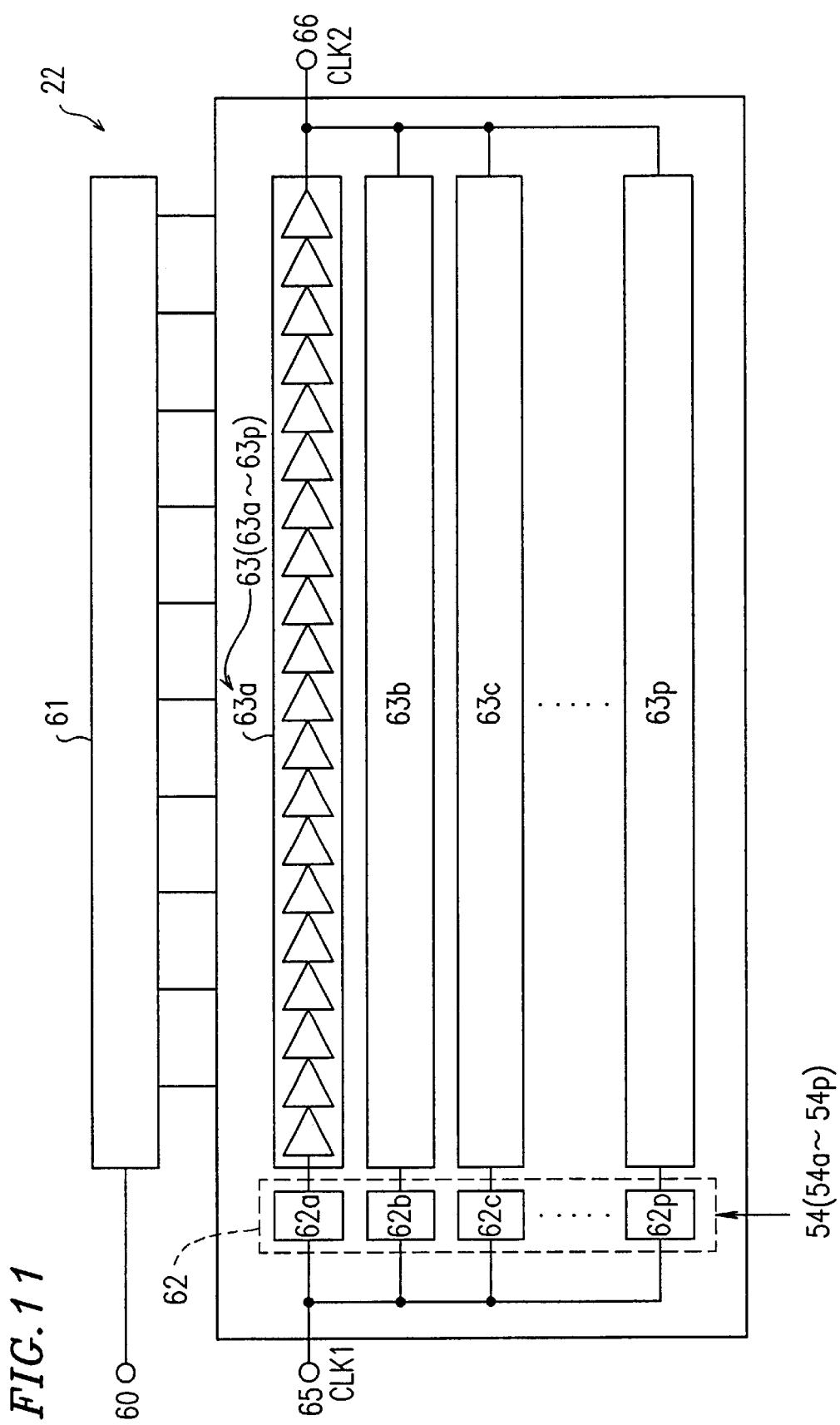
FIG. 11 is a diagram illustrating an example of a configuration of a clock phase adjustment circuit according to Example 1 of the present invention.

FIG. 11 is a diagram illustrating a detailed circuit configuration of the clock phase adjustment circuit 22 in each slave chip 2 of the semiconductor integrated circuit system 110 as illustrated in FIG. 2. As illustrated in FIG. 11, the clock phase adjustment circuit 22 includes a delay amount setting circuit 61, a clock signal input switching circuit 62 and a clock delay circuit 63.

The clock delay circuit 63 includes a plurality of delay circuits 63a to 63p. In each of the delay circuits 63a to 63p, an amount of delay in accordance with the system operating conditions such as the temperature and voltage is set. For example, a reference amount of delay is set in the delay circuit 63a so as to use the delay circuit 63a as a delay circuit for a normal condition. Similarly, the delay circuit 63b may be used for a normal temperature/low voltage condition, the delay circuit 63c for a normal temperature/high voltage, and the delay circuit 63d for a high temperature/reference voltage condition, for example. In the present example, 16 different delay amounts (respectively corresponding to the delay circuits 63a to 63p) can be set corresponding to 16 different output signals 54 provided by the extraction circuit 21. Moreover, the adjustment signal 54 (54a to 54p) output from the extraction circuit 21 is input to the clock signal input switching circuit 62.

At the above-described initialization, an initialization signal provided to the slave chip 2 from the master chip 1 is input to the delay amount setting circuit 61 via a delay amount setting signal input terminal 60. A predetermined amount of delay in accordance with the initialization signal is set (stored) in the delay amount setting circuit 61. The clock phase adjustment circuit 22 delays, by a predetermined amount, a clock signal (command clock CLK1) input from a clock input terminal 65 by using one of the delay circuits 63a to 63p (e.g., the delay circuit 63a for a normal condition) selected in accordance with the predetermined amount of delay stored in the delay amount setting circuit 61. Then, the delayed command clock CLK1 is output from a delayed clock output terminal 66 as a phase-adjusted clock signal (data clock CLK2).

The selection of one of the delay circuits 63a to 63p used in the clock delay circuit 63 is performed by the clock signal input switching circuit 62. The clock signal input switching circuit 62 includes switching elements 62a to 62p and selects one of the delay circuits 63a to 63p in accordance with the adjustment signal 54 (54a to 54p) so as to input the clock signal to the selected delay circuit. Each of the delay circuits 63a to 63p have respective delay amounts corresponding to the conditions (the temperature, the voltage, etc.) defined by the adjustment signal 54.

Thus, information indicating changes in the operating state of the semiconductor integrated circuit system 110 (i.e., changes in conditions such as the temperature and source voltage) is provided from the master chip 1 to the slave chip 2 via the command VT0 to VT3. In each slave chip 2, the change-related information is extracted (decoded) from a command provided by the extraction circuit 21, switching of the delay circuits 63a to 63p of the clock phase adjustment circuit 22 is performed based on the extracted information so as to re-set the amount of delay of the clock signal in accordance with changes in the condition. Thus, it is possible to suppress the variation in the clock signal among the slave chips due to changes in the operating state of the semiconductor integrated circuit system 110, thereby realizing the stable operation of the system.

In the clock phase adjustment circuit 22, the clock signal input switching circuit 62 is provided before (i.e., on the input side of) the clock delay circuit 63, so as to selectively use one of the delay circuits 63a to 63p. Alternatively, such a switching circuit may be provided after the clock delay circuit 63 so as to selectively output a clock having a predetermined amount of delay on the output side of the clock delay circuit 63. In order to ensure that the output of the delay circuit to which a signal is not input has a high impedance, a switching circuit may also be provided on the output-side clock delay circuit 63 as well as on the input side thereof.

Although only the temperature and source voltage are described as conditions indicating changes in the operating state of the semiconductor integrated circuit system 110 in the present example, it is also possible to employ any one of, or a combination of, other process variations in addition to or in lieu of the temperature and/or source voltage.

Next, another example of the configuration of the clock phase adjustment circuit 22 will be described.

Figure 12:
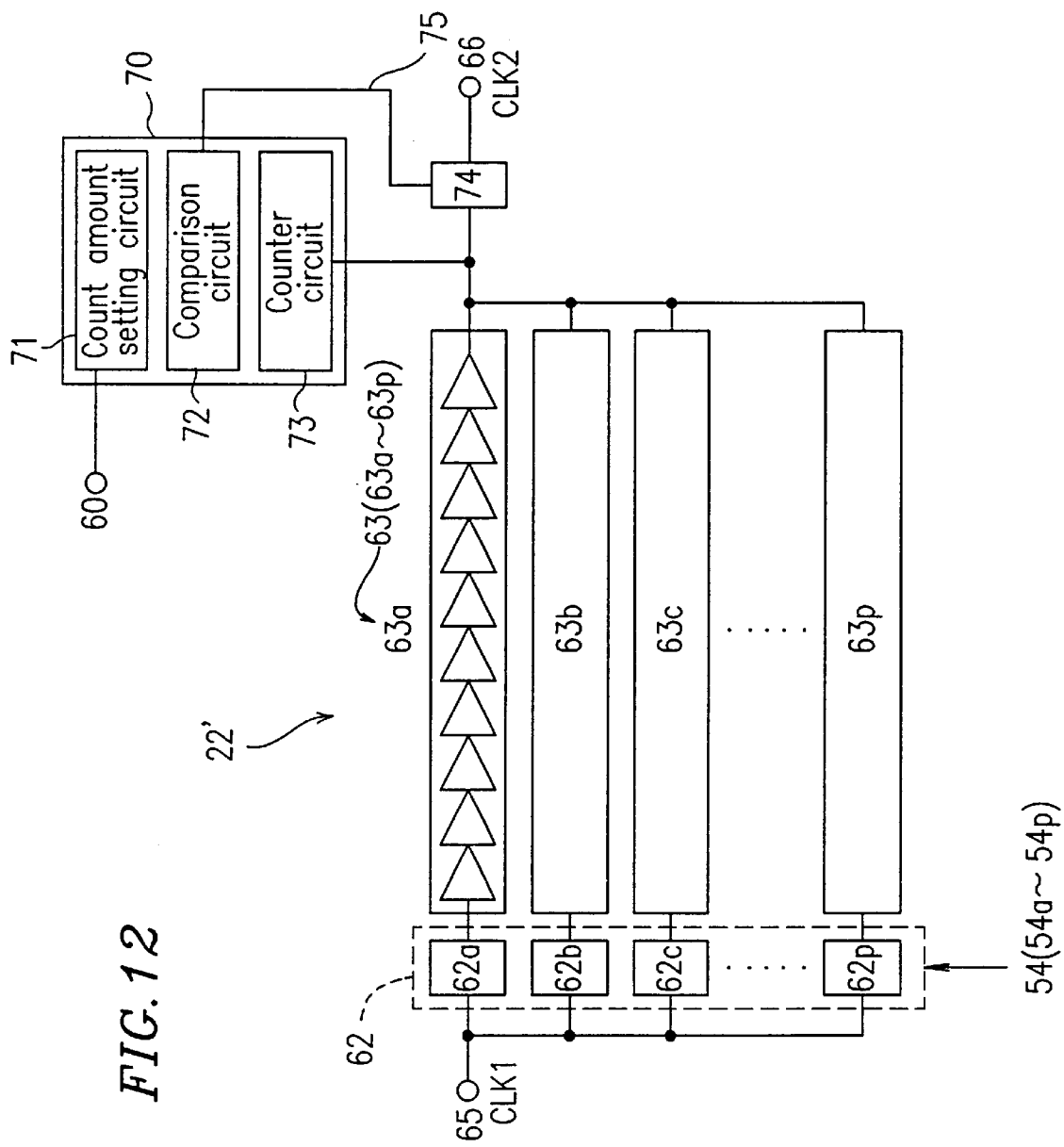
FIG. 12 is a diagram illustrating another example of a configuration of a clock phase adjustment circuit according to Example 1 of the present invention.

FIG. 12 is a diagram illustrating another example of the configuration of the clock phase adjustment circuit 22 (namely, a clock phase adjustment circuit 22') in each slave chip 2 of the semiconductor integrated circuit system 110 as illustrated in FIG. 2. As illustrated in FIG. 12, the clock phase adjustment circuit 22' includes a delay amount setting circuit 70, the clock signal input switching circuit 62, the output-side clock delay circuit 63 and an output-side clock path switching circuit 74. The delay amount setting circuit 70 includes a count amount setting circuit 71, a comparison circuit 72 and a counter circuit 73. Each of the elements which are also provided in the above-described clock phase adjustment circuit 22 is provided with the same reference numeral, and will not be described in detail below.

The operation of the clock phase adjustment circuit 22' is basically the same as that of the above-described clock phase adjustment circuit 22 (FIG. 11). The clock phase adjustment circuit 22' illustrated in FIG. 12 performs the setting of the delay time by controlling the number of times the input clock (command clock CLK1) passes through the clock delay circuit 63. Thus, the physical size of the clock delay circuit 63 can be reduced. The details will be described hereinafter.

The delay amount setting circuit 70 sets (stores), in the count amount setting circuit 71, a predetermined count value corresponding to an amount of delay to be set, in accordance with a delay amount setting signal provided from the master chip 1 to the delay amount setting signal input terminal 60 at initialization. The counter circuit 73 counts the number of clocks input to the counter circuit 73. The comparison circuit 72 compares the count number of the counter circuit 73 with the count setting value of the count amount setting circuit 71, and, if they match with each other, outputs a predetermined clock path switching signal 75 to the output-side clock path switching circuit 74.

The output-side clock path switching circuit 74, under the control of the clock path switching signal 75, outputs the data clock CLK2 from the delayed clock output terminal 66 only when the count number of the counter circuit 73 matches with the count setting value set in the count amount setting circuit 71.

The selection of one of the delay circuits 63a to 63p used in the clock delay circuit 63 is performed by the clock signal input switching circuit 62, as in the above-described example. After the predetermined count setting value has been reached, the output of the selected one of the delay circuits 63a to 63p is output via the output-side clock path switching circuit 74 as the data clock CLK2. Due to such a structure, it is possible to reduce the number of stages in the clock delay circuit 63, thereby reducing the circuit scale of the clock delay circuit 63.

Next, a still another example of the circuit configuration of the clock phase adjustment circuit 22 in the slave chip 2 of the semiconductor integrated circuit system 110 as illustrated in FIG. 2 will be described.

Figure 13:
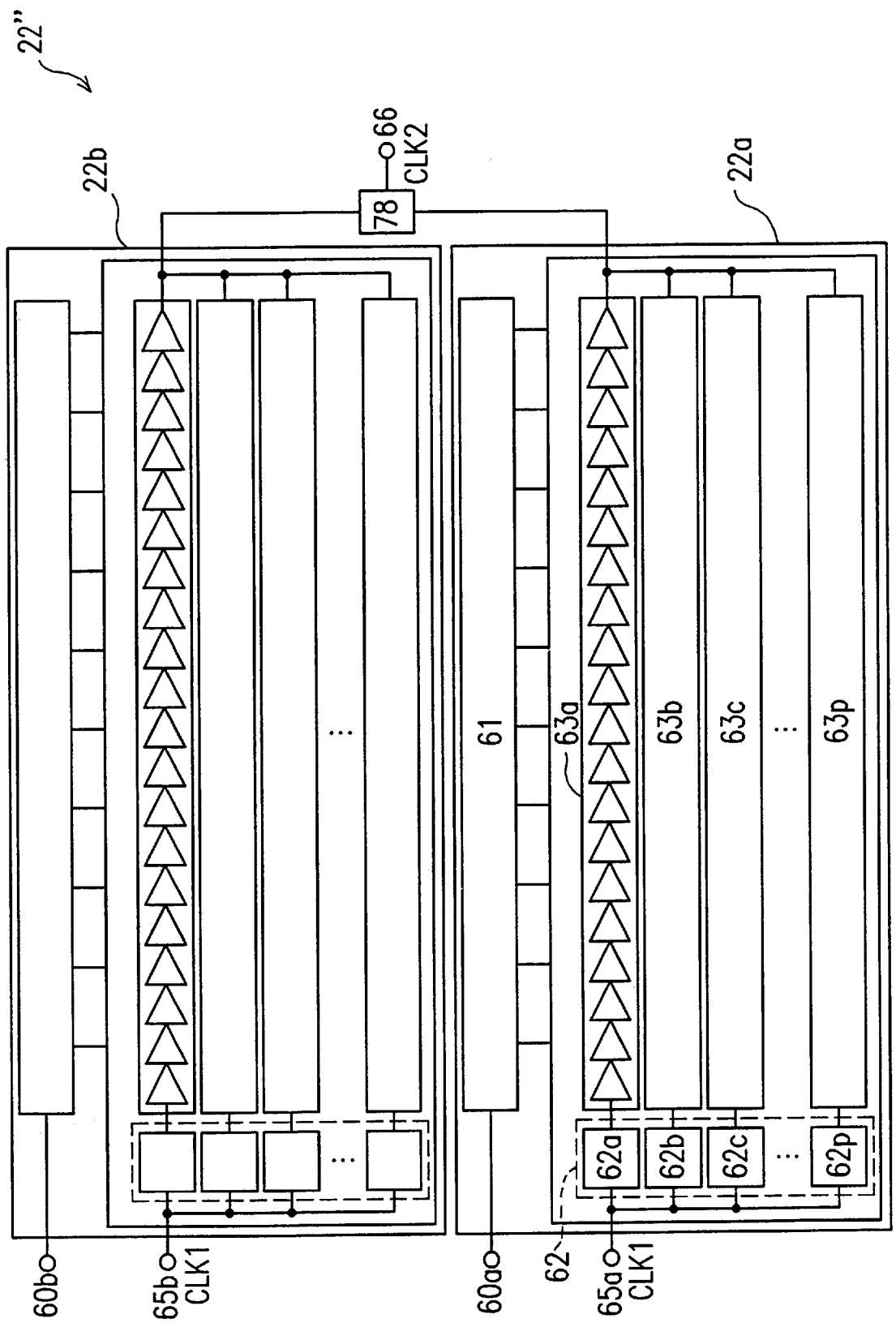
FIG. 13 is a diagram illustrating a still another example of a configuration of a clock phase adjustment circuit according to Example 1 of the present invention.

FIG. 13 is a diagram illustrating a configuration of a clock phase adjustment circuit 22'. As illustrated in FIG. 13, the clock phase adjustment circuit 22' includes a first clock phase adjustment unit 22a, a second clock phase adjustment unit 22b and an output switching circuit 78. The configuration and the operation of each of the first and second clock phase adjustment units 22a and 22b is the same as those of the above-described clock phase adjustment circuit 22 (FIG. 11). Each of the elements which are also provided in the above-described clock phase adjustment circuit 22 is provided with the same reference numeral, and will not be described in detail below.

As illustrated in FIG. 13, an initialization signal for setting (storing) a predetermined amount of delay at initialization is provided to a first delay amount setting signal input terminal 60a of the first clock phase adjustment unit 22a and to a second delay amount setting signal input terminal 60b of the second clock phase adjustment unit 22b. The command clock CLK1 is provided to a first clock input terminal 65a of the first clock phase adjustment unit 22a and to the second clock input terminal 65b of the second clock phase adjustment unit 22b. The internal operation of each of the first and second clock phase adjustment units 22a and 22b is the same as that of the above-described clock phase adjustment circuit 22.

The clock phase adjustment circuit 22" includes the two clock phase adjustment units 22a and 22b, which are used alternately. The clocks (data clocks CLK2) output from the first and second clock phase adjustment units 22a and 22b are alternately output by the output switching circuit 78.

For example, when a clock phase adjustment is performed for each cycle of a read/write operation, as described above, the first and second clock phase adjustment units 22a and 22b are alternately used, so that while the delay amount of one of the units is being adjusted, the other unit can be used.

The two clock phase adjustment units do not necessarily have to be used alternately, but one of the clock phase adjustment units may continuously output the data clock CLK2 for a predetermined period of time. Due to the configuration of the clock phase adjustment circuit 22', it is possible to prevent a clock delaying operation from being interrupted when re-setting a clock delay amount. Thus, while the delay amount of one of the clock phase adjustment units is being set, the other unit can be operated, so that it is possible to perform the delay operation (phase adjustment operation) in an uninterrupted manner.

EXAMPLE 2

In the above-described semiconductor integrated circuit system 110 of Example 1, changes in the operating environment of the system are detected by the master chip 1, and the phase of the data clock (i.e., the data output clock from each slave chip) is adjusted by each slave chip 2 in accordance with the changes in the operating state of the system based on the command provided by the master chip 1.

According to the present example, each slave chip (semiconductor integrated circuit) is provided with a circuit for detecting changes in the operating environment of the system. The semiconductor integrated circuit of the present example includes a circuit for adjusting the phase of the data output clock which determines the timing of data output in accordance with the positional relationship with respect to the master chip, and further includes a circuit for preventing the operation of the data output clock phase adjustment circuit from changing due to changes in the operating environment of the system (e.g., the temperature, the source voltage, etc.).

Hereinafter, the present example will be described in greater detail with reference to the Figures.

Figure 14:
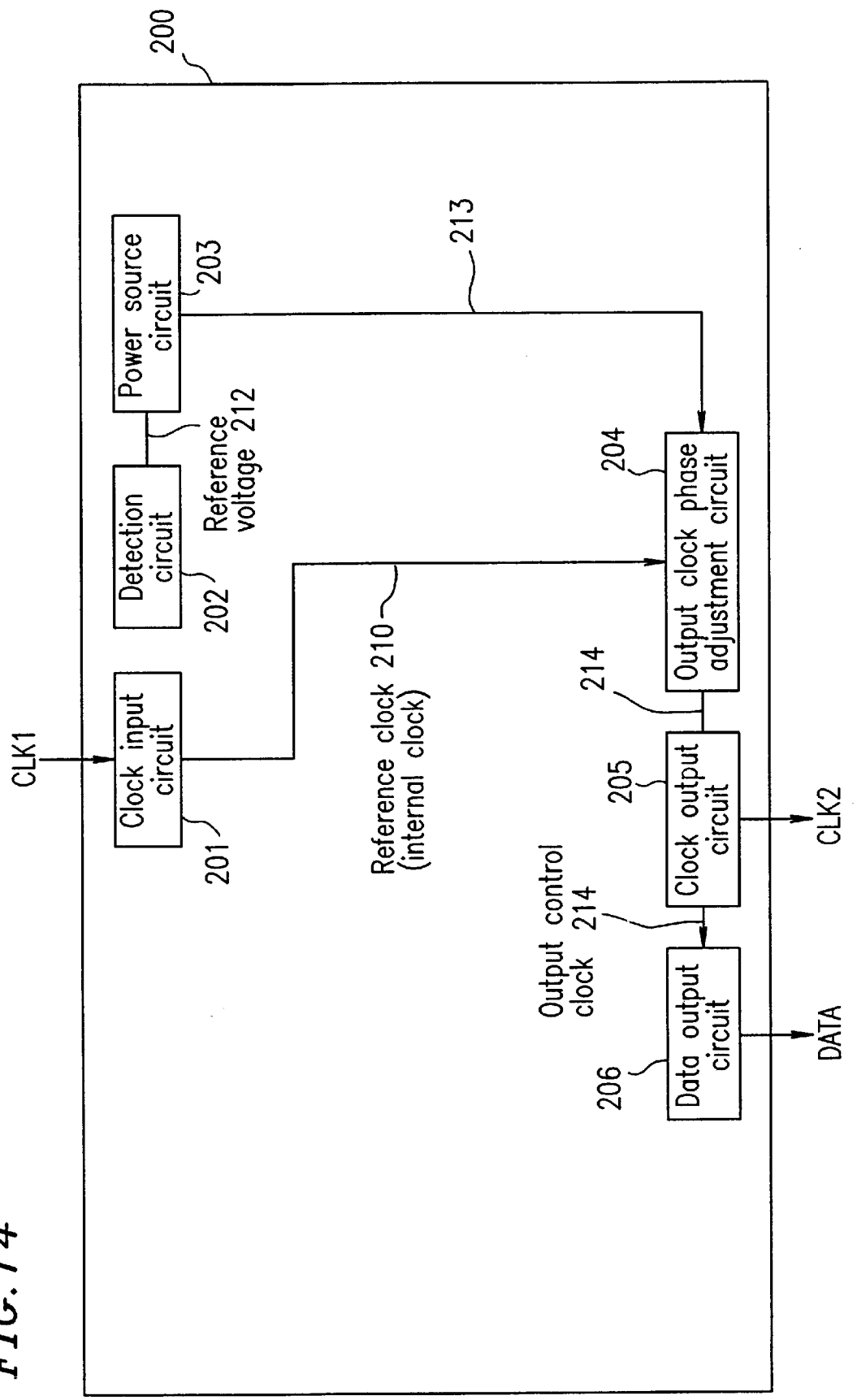
FIG. 14 is a block diagram illustrating a semiconductor integrated circuit according to Example 2 of the present invention.

FIG. 14 is a block diagram schematically illustrating a configuration of a semiconductor integrated circuit (slave chip) 200 according to Example 2 of the present invention. As illustrated in FIG. 14, the semiconductor integrated circuit 200 includes a clock input circuit 201 for receiving an externally-fed clock, a detection circuit 202 for detecting changes in the operating environment of the system, a power source circuit 203 for an output clock phase adjustment circuit (hereinafter, referred to simply as the "power source circuit 203"), an output clock phase adjustment circuit 204, a clock output circuit 205 and a data output circuit 206.

As illustrated in FIG. 14, the clock CLK1 which is provided from the outside of the semiconductor integrated circuit 200 (e.g., from the master chip) is input to the clock input circuit 201 of the semiconductor integrated circuit 200. The clock input circuit 201 outputs the input clock CLK1 as a reference clock 210 to the output clock phase adjustment circuit 204. The detection circuit 202 detects changes in the temperature and voltage, and outputs to the power source circuit 203 a reference voltage 212, which is determined based on the changes. The power source circuit 203 outputs a power source potential 213 for a clock phase adjustment circuit in accordance with the input reference voltage 212.

The output clock phase adjustment circuit 204 shifts, by a predetermined value (amount of delay), the phase of the reference clock 210 provided by the clock input circuit 201 in accordance with the power source potential 213 provided by the power source circuit 203, and outputs the phase-shifted clock as an output control clock 214 to the clock output circuit 205. The clock output circuit 205 outputs the output control clock 214 to the data output circuit 206 while also outputting the output control clock 214, as a strobe signal (clock CLK2) for data output by the data output circuit 206, simultaneously with the output data, to the outside of the semiconductor integrated circuit 200.

The detection circuit 202 can be configured with a PLL circuit, for example. Hereinafter, an example where the detection circuit 202 is a PLL circuit will be described in greater detail.

Figure 15:
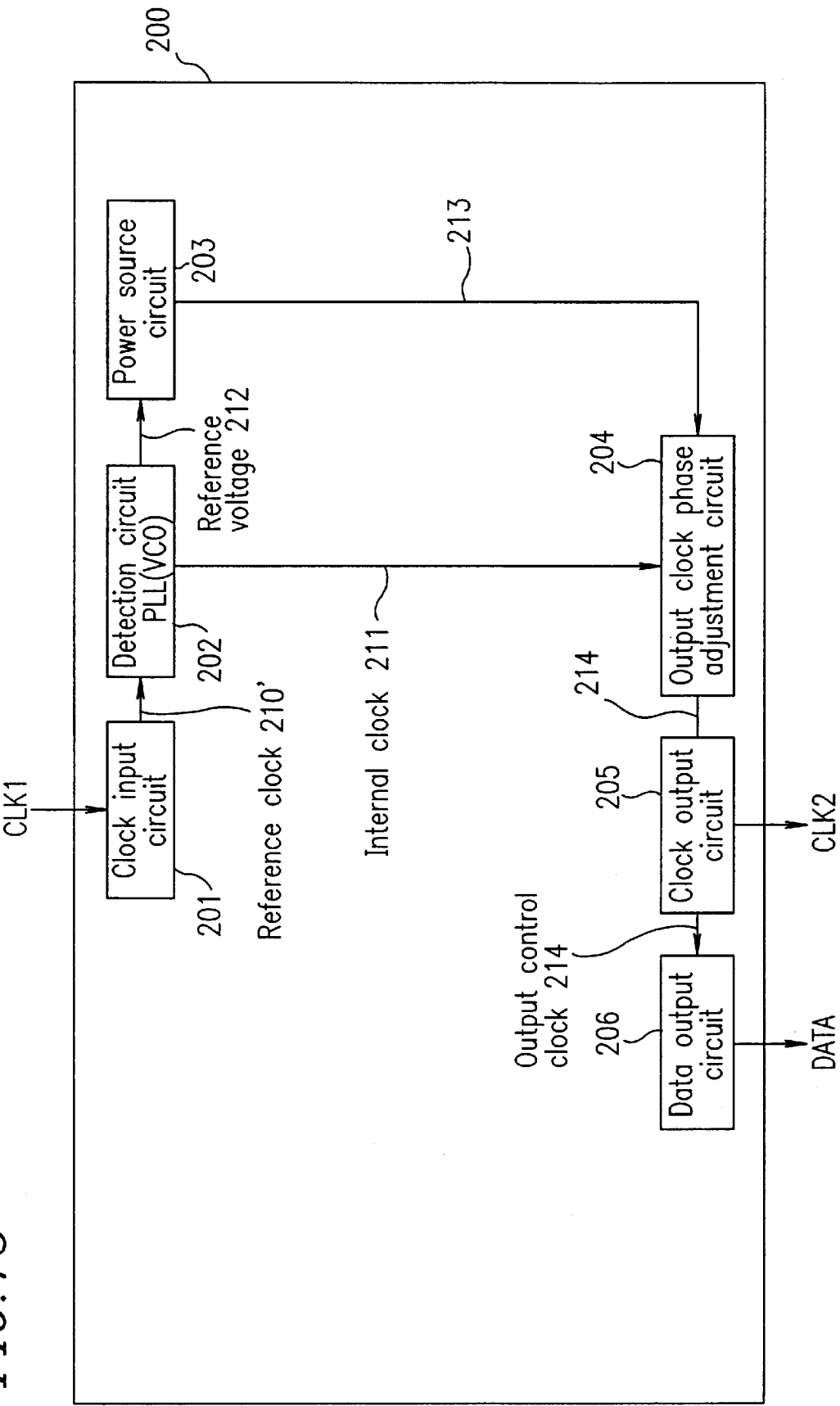
FIG. 15 is a block diagram illustrating a semiconductor integrated circuit according to Example 2 of the present invention where a detection circuit is configured with a PLL.

FIG. 15 illustrates a configuration of the semiconductor integrated circuit 200 where the detection circuit 202 is a PLL circuit. As illustrated in FIG. 15, the clock CLK1 provided from the outside of the semiconductor integrated circuit 200 (e.g., from the master chip) is input to the clock input circuit 201 of the semiconductor integrated circuit 200. The clock input circuit 201 outputs the input clock CLK1 as a reference clock 2101 to the detection circuit 202.

The detection circuit (PLL) 202 includes a VC0 for producing an internal clock, and varies the potential of the VC0 so as to synchronize an internal clock 211 with the input reference clock 210'. The detection circuit 202 provides, as the reference voltage 212, the potential of the VC0 at the time when the internal clock 211 is synchronized with the reference clock 210' to the power source circuit 203. The power source circuit 203 outputs the power source potential 213 for a clock phase adjustment circuit based on the input reference voltage 212.

The detection circuit 202 provides the internal clock 211 synchronized with the reference clock 210' (i.e., the phase of the reference clock 210' is equal to that of the internal clock 211) to the output clock phase adjustment circuit 204. The output clock phase adjustment circuit 204 shifts, by a predetermined value (amount of delay), the input internal clock 211, and outputs the shifted clock as the output control clock 214 to the clock output circuit 205. The clock output circuit 205 outputs the output control clock 214 to the data output circuit 206.

The data output circuit 206 outputs data in the semiconductor integrated circuit 200 in accordance with the provided output control clock 214. The data in the semiconductor integrated circuit 200 is, for example, data read out from a memory, the result of a predetermined arithmetic operation, or the like. Moreover, simultaneously with the data output by the data output circuit 206, the clock output circuit 205 outputs the output control clock 214 as a strobe signal for the output data.

When the operating environment (e.g., the temperature, the source voltage, etc.) of the semiconductor integrated circuit 200 changes, the operation of the output clock phase adjustment circuit 204 changes accordingly. In the present example, the power source circuit 203 is employed in order to prevent such a change in the operation of the output clock phase adjustment circuit 204. Thus, when the temperature, the source voltage, etc., changes, the detection circuit 202 varies the potential of the VC0 in the detection circuit 202 in order to match the phase of the externally-input reference clock 210' with that of the input internal clock 211. Since the power source circuit 203 uses the potential of the VC0 (the reference voltage 212) as the reference voltage for the operation thereof, the power source potential 213 for a clock phase adjustment circuit, which is output by the power source circuit 203, changes in accordance with the change in the reference voltage 212. Due to the power source potential 213 which changes as described above, the change in the operation of the output clock phase adjustment circuit 204 is suppressed.

Figure 16:
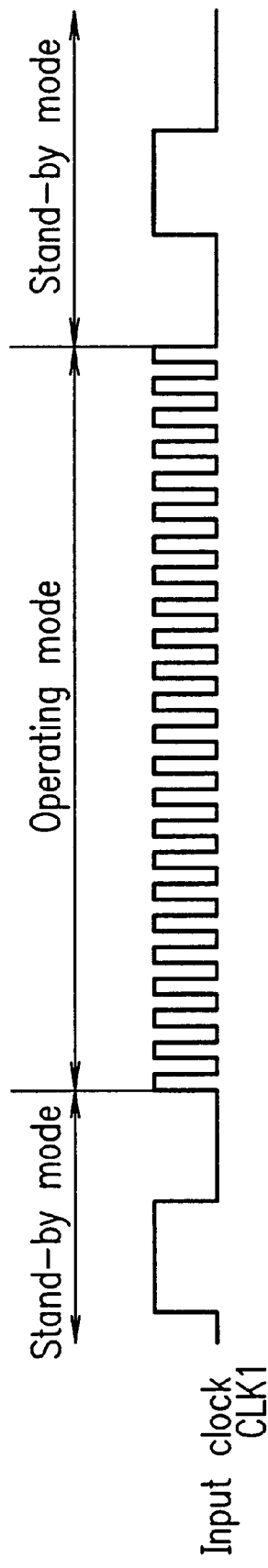
FIG. 16 is a diagram illustrating a waveform of an input clock according to Example 2 of the present invention.

FIG. 16 illustrates a waveform of a clock input to the semiconductor integrated circuit 200. As illustrated in FIG. 16, the frequency of the input clock is lower in a stand-by mode than in an operating mode. By setting the frequency of the input clock as described above, it is possible to suppress the current consumption by the semiconductor integrated circuit 200 in a stand-by mode.

Figure 17:
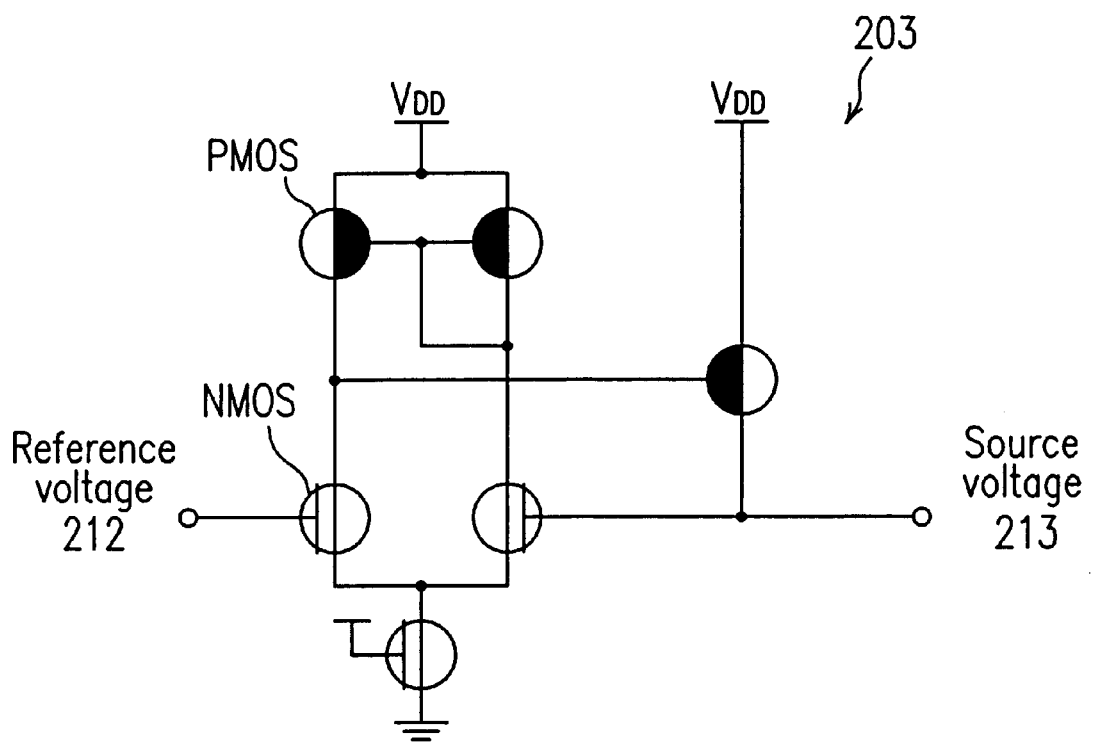
FIG. 17 is a diagram illustrating an example of a configuration of a power source circuit for a clock phase adjustment circuit used in an example of the present invention.

FIG. 17 illustrates an example of a circuit configuration of the power source circuit 203. As illustrated in FIG. 17, the power source circuit 203 generates the source voltage 213 in accordance with the change in the reference voltage 212.

Moreover, in order to reduce the power consumption by the semiconductor integrated circuit 200, the power source circuit 203 may be configured to include two power source circuits; one for an operating mode and another for a stand-by mode. The power source circuit for an operating mode may be one which has a high response speed and a large power consumption. On the other hand, the power source circuit for a stand-by mode may be one which has a low response speed and a small power consumption. By configuring the power source circuit 203 as described above, it is possible to reduce the power consumption in a stand-by mode while maintaining a high-speed operation in an operating mode.

Furthermore, in order to reduce the power consumption by the semiconductor integrated circuit 200 as illustrated in FIG. 15, a clock frequency divider may be provided. For example, in FIG. 15, the reference clock 210' output by the clock input circuit may be provided intact to the output clock phase adjustment circuit 204, while providing it to the detection circuit 202 as a frequency-divided clock after dividing the frequency thereof using the frequency division circuit.

Figure 18:
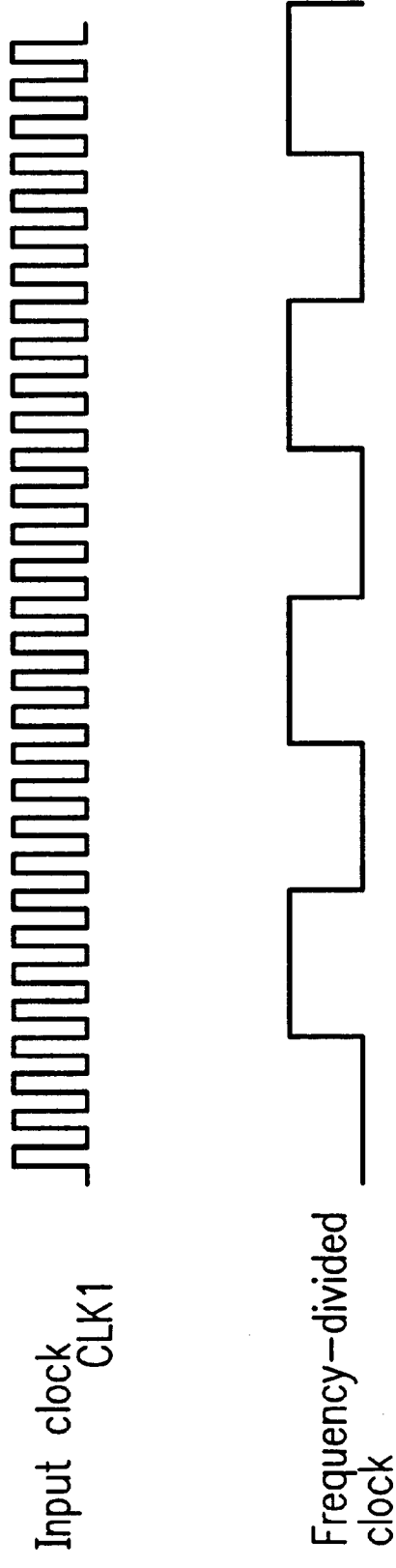
FIG. 18 is a diagram illustrating waveforms of an input clock and a frequency-divided clock.

FIG. 18 illustrates timing diagrams for the input clock and the frequency-divided clock. As illustrated in FIG. 18, the frequency of the divided clock is lower than that of the input clock, so that voltage setting may be performed in the power source circuit 203 at a low frequency, thereby reducing the power consumption accordingly.

Figure 19:
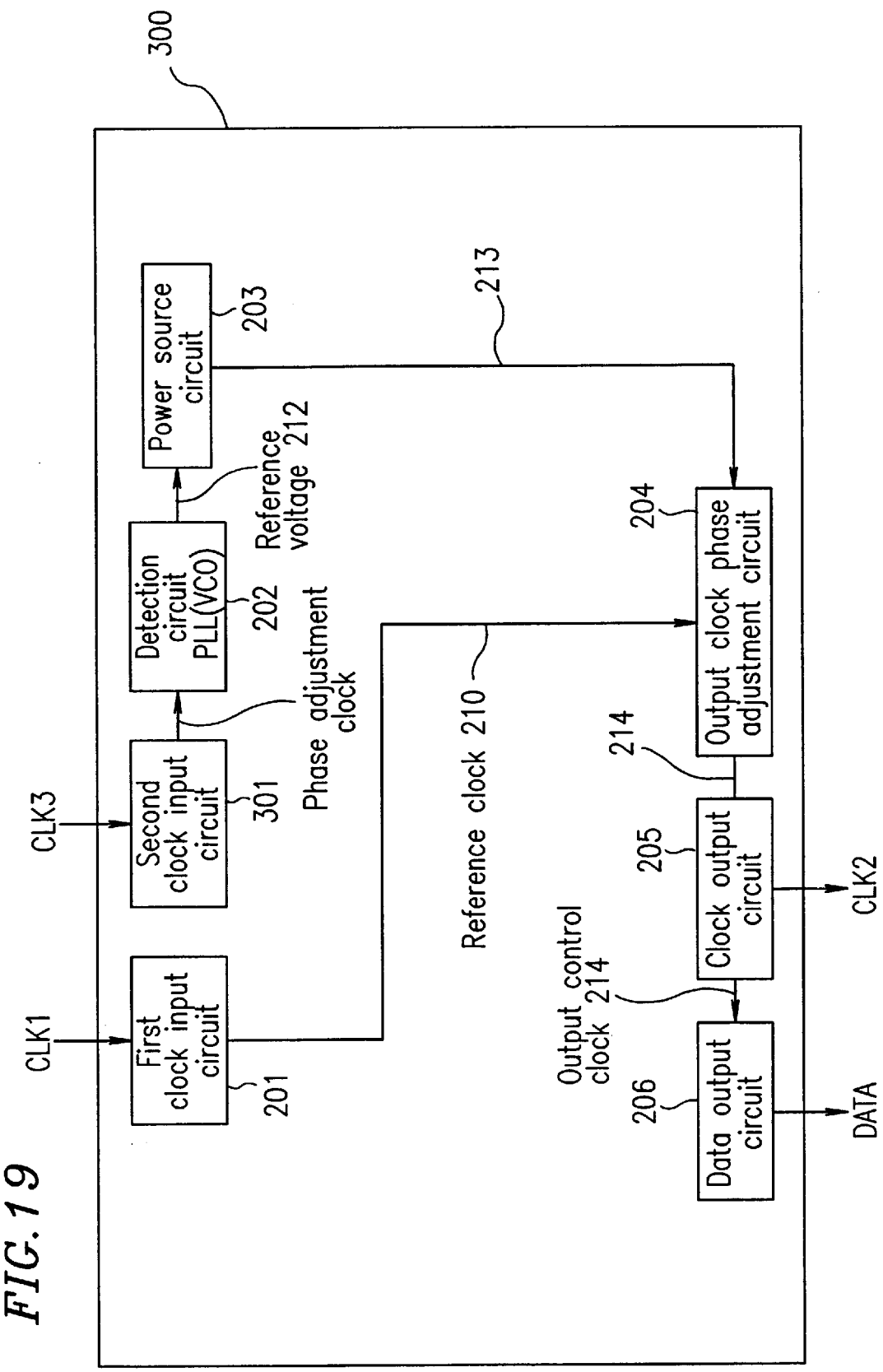
FIG. 19 is a block diagram illustrating a semiconductor integrated circuit according to Example 2 of the present invention.

FIG. 19 is a block diagram illustrating a configuration of another semiconductor integrated circuit 300 of the present example. As illustrated in FIG. 19, the semiconductor integrated circuit 300 includes the clock input circuit 201, as a first clock input circuit, and a second clock input circuit 301.

Other than this, the configuration of the semiconductor integrated circuit 300 is the same as that of the semiconductor integrated circuit 200 as illustrated in FIG. 15, and like components are provided with like reference numerals and will not described in detail.

The clock CLK1 provided by the master chip, or the like, is input to the first clock input circuit 201. The clock CLK1 input to the first clock input circuit 201 is provided to the output clock phase adjustment circuit 204 as the reference clock 210. The second clock input circuit 301 is a temperature/voltage adjustment clock input circuit, to which a clock CLK3 is input. The clock CLK3 is used for adjusting the phase of the clock as the operating environment (e.g., the temperature, the voltage, etc.) changes.

FIG. 20 is a timing diagrams for the input clock CLK1 and the temperature/voltage adjustment clock CLK3 used in the semiconductor integrated circuit 300. As illustrated in FIG. 20, the frequency of the temperature/voltage adjustment clock CLK3 is lower than that of the input clock CLK1. Therefore, voltage setting may be performed in the power source circuit 203 at a low frequency, thereby reducing the power consumption accordingly. Moreover, when two different clock input circuits are provided, as described above, it is not necessary to alter the frequency of the input clock CLK1 between an operating mode and a stand-by mode, as is necessary in the example illustrated in FIG. 16. Thus, the control for switching between an operating mode and a stand-by mode is simplified.

The clock phase adjustment in the case where the detection circuit 202 is a PLL circuit has been described above. However, any other circuit which has a similar function (e.g., a DLL circuit) may also be used as the detection circuit 202 instead of the PLL circuit.

As described above, in the semiconductor integrated circuit system of the present invention, the clock phase adjustment circuit of each slave chip can be re-set based on information output by the detection circuit for detecting changes in the operating environment (e.g., the temperature, the source voltage, etc.). Therefore, the clock phase adjustment circuit of each slave chip can be stably operated even when the operating environment changes. Thus, it is possible to provide: a semiconductor integrated circuit system capable of stably operating at a high speed even when a semiconductor integrated circuit system has IC chips from various manufacturers, or when the circuit characteristics (e.g., the temperature dependency, the voltage dependency, etc.) vary among respective IC chips; a semiconductor integrated circuit for use in such a semiconductor integrated circuit system; and a method for driving such a semiconductor integrated circuit system.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit system, having one master chip and a plurality of slave chips, for performing data transfer under a control of a predetermined clock, the system comprising:

a detection section for detecting a change in an operation state of the semiconductor integrated circuit system and for producing information indicating the detection result, the operation state including at least one of temperature and source voltage, the master chip receiving information on a detection result and transmitting the information to the slave chips; and at least one clock phase adjustment section for receiving the information and for adjusting a phase of a clock used in transferring data output by the slave chip during operation in the changed operation state based on the information.

2. A semiconductor integrated circuit system according to claim 1, wherein the detection section is controlled by the master chip, and the at least one clock phase adjustment section is included in the slave chip.

3. A semiconductor integrated circuit system according to claim 2, wherein the master chip and the plurality of slave chips are each connected to a command bus for transferring a command, a first clock line carrying a command clock for controlling the command transfer, a data bus for transferring data and a second clock line carrying a data clock for controlling the data transfer, the detection section being provided in the master chip, the master chip further comprising:

a command production section for producing a command including as a part thereof the information produced by the detection section; and a command output section for outputting the command to the command bus based on the command clock, the slave chip comprising:

a clock input section for receiving the command clock from the first clock line;

an input section for receiving the command from the command bus in accordance with the command clock;

an extraction section for extracting the information included in the received command;

a data output section for outputting data in the slave chip to the data bus in accordance with the data clock; and a clock output section for outputting the data clock to the second clock line, and the at least one clock phase adjustment section receiving the command clock and producing a data clock by adjusting a phase of the command clock based on the change in the operation state of the semiconductor integrated circuit system indicated by the information extracted by the extraction section.

4. A semiconductor integrated circuit system according to claim 3, wherein:

the command is transferred in a packet; and the command production section produces a command packet including the information and a chip ID.

5. A semiconductor integrated circuit system according to claim 2, wherein the at least one clock phase adjustment section comprises a plurality of delay units which are selectively used based on the change in the operation state of the semiconductor integrated circuit system.

6. A semiconductor integrated circuit system according to claim 1, wherein each of the plurality of slave chips comprises the detection section and the at least one clock phase adjustment section.

7. A semiconductor integrated circuit system according to claim 6, wherein the master chip and the plurality of slave chips are each connected to a command bus for transferring a command, a first clock line carrying a command clock for controlling the command transfer, a data bus for transferring data and a second clock line carrying a data clock for controlling the data transfer, each of the plurality of slave chips further comprises:

a clock input section for receiving the command clock from the first clock line;

an input section for receiving the command from the command bus in accordance with the command clock;

a data output section for outputting data in the slave chip obtained based on the received command to the data bus in accordance with the data clock; and a clock output section for outputting the data clock to the second clock line, and the at least one clock phase adjustment section producing the data clock by adjusting a phase of the command clock based on the change in the operation state of the semiconductor integrated circuit system indicated by the information provided by the detection section.

8. A semiconductor integrated circuit system according to claim 1, the at least one clock phase adjustment section comprising first and second clock phase adjustment sections, wherein while one of the first clock phase adjustment section and the second clock phase adjustment section is performing phase adjustment in one operating cycle, the other one prepares for phase adjustment in a next operating cycle.

9. A semiconductor integrated circuit operating in synchronization with a predetermined clock, the semiconductor integrated circuit comprising:

a clock input section for receiving a command clock;

a command input section for receiving a command in accordance with the command clock, the command including information indicating a change in an operation state which includes at least one of temperature and source voltage;

the command clock and command being supplied by a master chip;

an extraction section for extracting the information from the received command;

at least one clock phase adjustment section for producing a data clock by adjusting a phase of the received command clock based on the change in the operation state indicated by the information extracted by the extraction section;

a data output section for outputting data in the slave chip during operation in the changed operation state in accordance with the data clock; and a clock output section for outputting the data clock.

10. A semiconductor integrated circuit according to claim 9, the at least one clock phase adjustment section comprising first and second clock phase adjustment sections, wherein while one of the first clock phase adjustment section and the second clock phase adjustment section is performing phase adjustment in one operating cycle, the other one prepares for phase adjustment in a next operating cycle.

11. A semiconductor integrated circuit operating in synchronization with a predetermined clock, the semiconductor integrated circuit comprising:

a clock input section for inputting a reference clock;

a synchronization section for producing an internal clock corresponding to a source potential, the synchronization section receiving the reference clock, outputting the internal clock in synchronization with the reference clock by changing the source potential in accordance with a change in an operation state of the semiconductor integrated circuit which includes at least one of temperature and source voltage, and outputting as a reference voltage signal a source potential which is determined by synchronizing the internal clock with the reference clock;

a command clock and a command being supplied by a master chip;

a supply voltage generation section for generating a supply voltage based on the reference voltage signal;

a clock phase adjustment section for receiving the internal clock, and outputting an output control clock by adjusting a phase of the internal clock based on the supply voltage; and a data output section for outputting data in the semiconductor integrated circuit during operation in the changed operation state in accordance with the output control clock.

12. A semiconductor integrated circuit according to claim 11, wherein a frequency of the reference clock in an operating mode of the semiconductor integrated circuit is different from that in a stand-by mode of the semiconductor integrated circuit system.

13. A semiconductor integrated circuit according to claim 12, wherein the frequency of the reference clock in the operating mode is greater than that in the stand-by mode.

14. A semiconductor integrated circuit according to claim 11, wherein the supply voltage generation section includes a first supply voltage generation section used in an operating mode of the semiconductor integrated circuit and a second supply voltage generation section used in a stand-by mode of the semiconductor integrated circuit.

15. A method for driving a semiconductor integrated circuit system which has one master chip and a plurality of slave chips for performing data transfer under a control of a predetermined clock, the method comprising the steps of:

initializing a data transfer clock in each slave chip after power-up and before starting a read/write operation;

detecting changes in an operation state of the semiconductor integrated circuit including temperature and source voltage so as to produce an information signal indicating the detection result; and adjusting a phase of the initialized data transfer clock to be used for data transfer during operation in the changed operation state in each slave chip based on the information signal, wherein the master chip receives the information signal indicating the detection result and sends information relating thereto to the plurality of slave chips.

* * * * *